(12) United States Patent
Chien et al.

(10) Patent No.: US 8,279,656 B2
(45) Date of Patent: Oct. 2, 2012

(54) NONVOLATILE STACKED NAND MEMORY

(75) Inventors: Wei-Chih Chien, Sijhih (TW); Yan-Ru Chen, Hsinchu (TW); Yi-Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 129 days.

(21) Appl. No.: 12/928,396

(22) Filed: Dec. 10, 2010

(65) Prior Publication Data

US 2011/0317471 A1 Dec. 29, 2011

Related U.S. Application Data

(60) Provisional application No. 61/358,841, filed on Jun. 25, 2010.

(51) Int. Cl.
*G11C 11/00* (2006.01)

(52) U.S. Cl. ............. 365/148; 365/158; 365/51; 365/63
(58) Field of Classification Search .................. 365/148, 365/158, 175, 51, 63, 163; 257/2, 4, E45.003, 257/E21.461
See application file for complete search history.

(56) References Cited

U.S. PATENT DOCUMENTS 7,978,496 B2 * 7/2011 Kumar et al. ................. 365/148

* cited by examiner

*Primary Examiner* — David Lam
(74) *Attorney, Agent, or Firm* — Kenta Suzue; Haynes Beffel & Wolfeld LLP

(57) ABSTRACT

A memory cell is arranged to enhance the electrical field of the memory element. The memory cell has a metal-oxide memory element, a nonconductive element, and a conductive element. The metal-oxide memory element is in a current path between a first electrode at a first voltage and a second electrode at a second voltage. The nonconductive element is adjacent to the metal-oxide memory element.

22 Claims, 23 Drawing Sheets

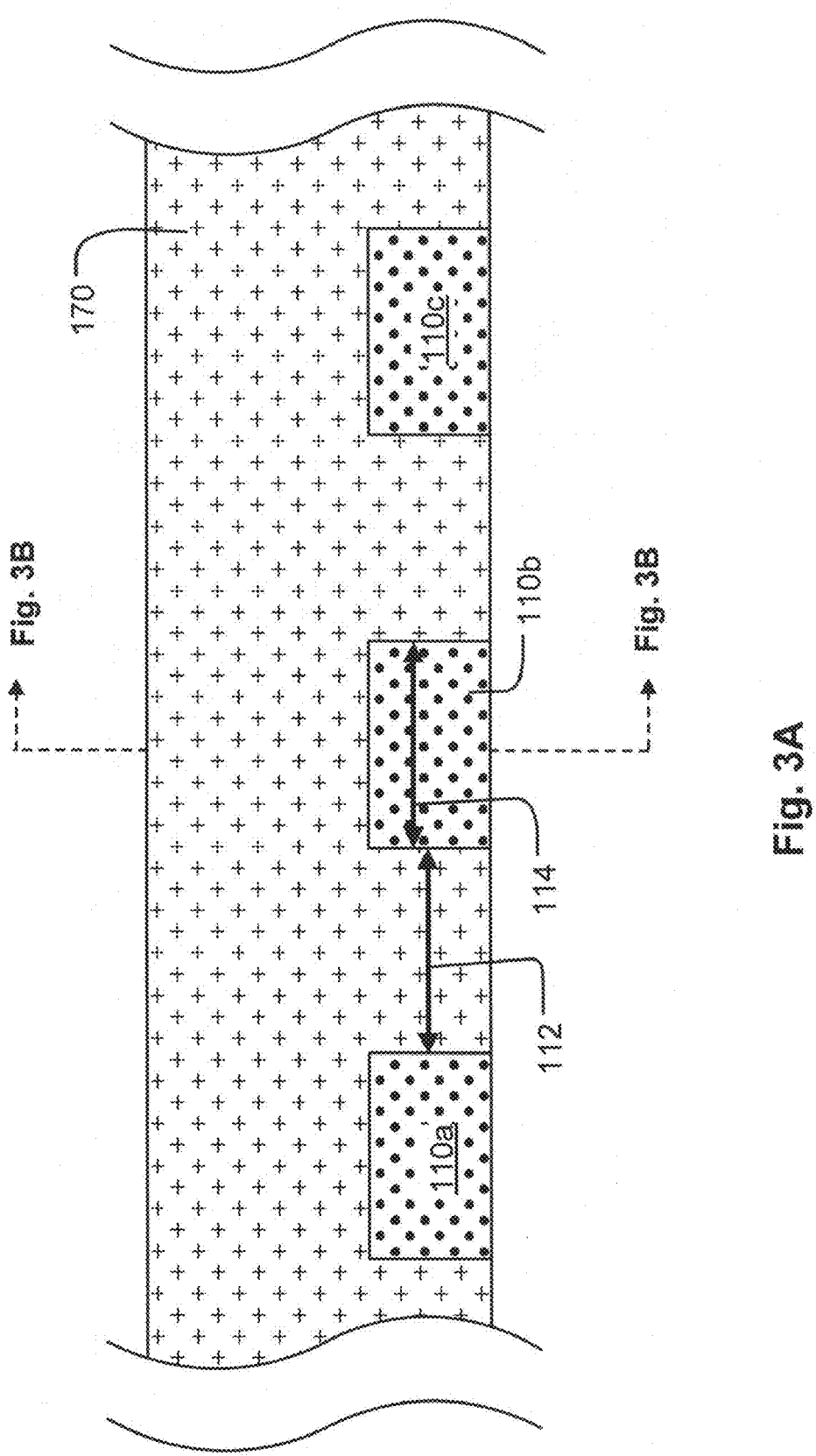

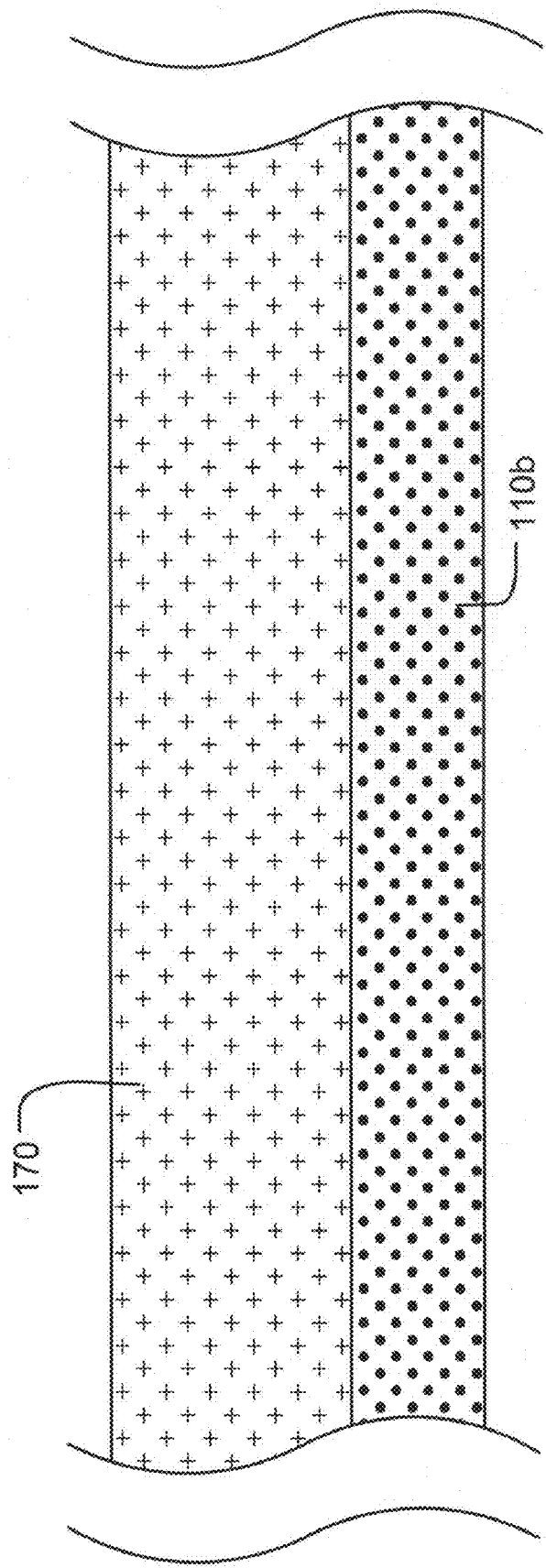

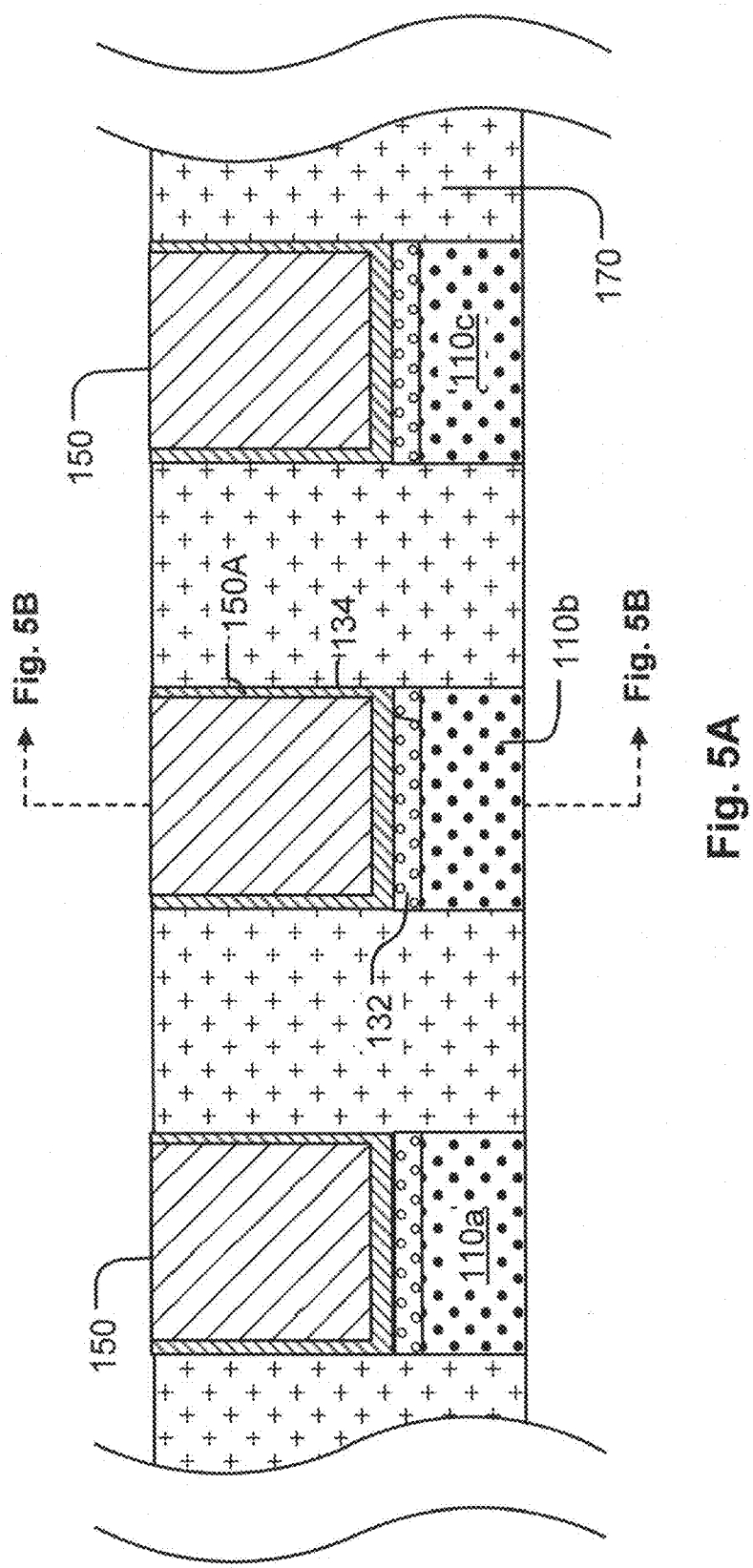

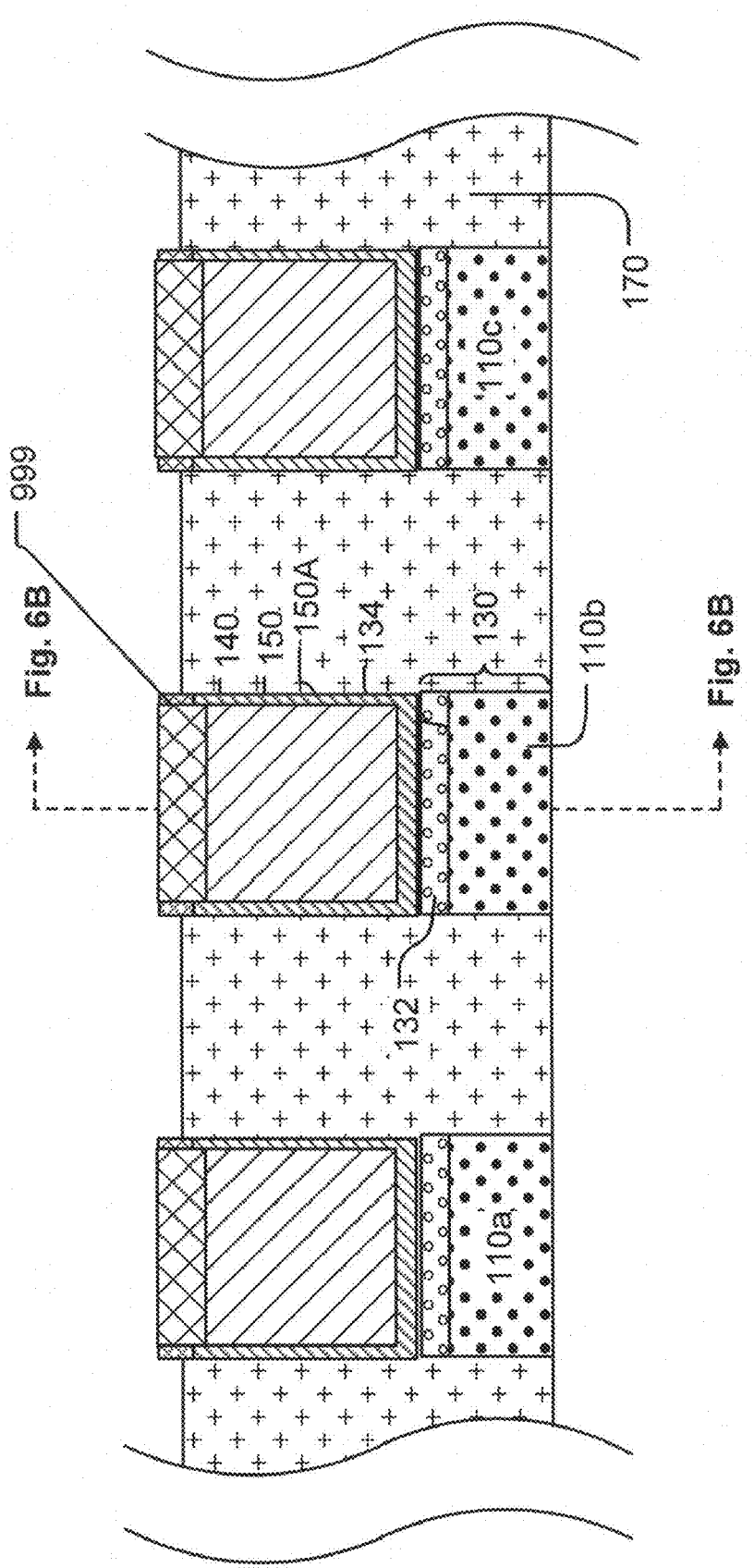

NONVOLATILE STACKED NAND MEMORY

REFERENCE TO RELATED APPLICATIONS

This application claims the benefit of U.S. Provisional Patent Application No. 61/358,841 filed 25 Jun. 2010, hereby incorporated by reference.

BACKGROUND

Resistive RAM is a promising nonvolatile memory. In particular, WOx RRAM has promising memory characteristics, as discussed in M. J Lee, "2-stack 1D-1R Cross-point Structure with Oxide Diodes as Switch Elements for High Density Resistance RAM Applications" IEDM pp. 771-774, 2007; and C. H. Ho, "A Highly Reliable Self-Aligned Graded Oxide WOx Resistance Memory: Conduction Mechanisms and Reliability" Symp. VLSI Tech., pp. 228-229, 2007; and U.S. Provisional Application 61/296,231 filed 19 Jan. 2010.

This discussed memory has a plug shape, and is associated with a relatively high current requirement when forming the memory cell.

SUMMARY

One aspect is a memory device including a metal-oxide memory element, a nonconductive element, and a conductive element.

The metal-oxide memory element is in a current path between a first electrode at a first voltage and a second electrode at a second voltage. For example, the first and second electrodes are top and bottom electrodes. Other embodiments have different arrangements of the electrodes. The nonconductive element is adjacent to the metal-oxide memory element. In one embodiment, the nonconductive element comprises an oxide of a liner on the second electrode.

The conductive element in the current path between the first electrode and the second electrode. In one embodiment, the conductive element comprises a liner on the second electrode and a plug in the liner. The conductive element has a first part at a first distance from the first electrode, and a second part at a second distance from the first electrode, such that the first distance larger than the second distance.

The metal-oxide memory element is between the first part of the conductive element and the first electrode. The nonconductive element is between the second part of the conductive element and the first electrode. In many embodiments, this arrangement enhances the electrical field in the nonconductive element, and also in the metal-oxide memory element portion proximate to the nonconductive element.

Some embodiments include circuitry performing a reset operation and a set operation on the metal-oxide memory element. In another embodiment, prior to regular operation the circuitry does not perform a forming operation distinct from the reset operation and the set operation. This is a benefit of the enhanced electrical field of the memory cell. In one embodiment, the reset operation and the set operation have a common voltage polarity. In another embodiment, the reset operation and the set operation have opposite voltage polarities.

In various embodiments, the memory device is an oxide resistive RAM, or a magnetic tunnel junction RAM.

Another aspect of the technology is a method of making a memory device, comprising the steps of:

forming a conductive element in a cavity over a first electrode, the conductive element including a first conductive material and a second conductive material;

forming a metal-oxide memory element of the memory device from the first conductive material of the conductive element;

forming a nonconductive element from the second conductive material of the conductive element, the metal-oxide memory element adjacent to the nonconductive element; and forming a second electrode over the metal-oxide memory element and the conductive element, such that (i) the metal-oxide memory element has a first thickness between a remainder of the conductive element and the second electrode, and (ii) the nonconductive element has a second thickness between the remainder of the conductive element and the second electrode, the first thickness being larger than the second thickness.

In one embodiment, the step of forming the metal-oxide memory element and the step of forming the nonconductive element, are performed together, by oxidizing a surface of the conductive element.

In some embodiments, the step of forming the conductive element, includes forming the conductive element with a surface including the first conductive material and the second conductive material. The first conductive material adjacent is to the second conductive material at the surface.

Some embodiments include the step of forming circuitry. The circuitry performs a reset operation and a set operation on the metal-oxide memory element. In another embodiment, prior to set and reset operations for regular use of the memory cell, a forming operation distinct from the set and reset operations is unnecessary. The field enhancement arrangement makes the electrical field sufficiently high with a regular operation to begin regular use of a fresh memory cell. In one embodiment, the reset operation and the set operation have a common voltage polarity. In another embodiment, the reset operation and the set operation have opposite voltage polarities.

In some embodiments, the second electrode is oxygen inert. An oxygen inert electrode is associated with a wide resistance window.

In some embodiments, the step of forming the nonconductive element comprises: oxidizing a conductive liner of the conductive element on the bottom electrode.

In some embodiments, the step of forming the conductive element comprises:

forming a conductive liner on the bottom electrode; and forming a conductive plug in the conductive liner.

In various embodiments, the method makes an oxide resistive RAM or a magnetic tunnel junction RAM.

Yet another aspect is a memory device comprising a cross-point array of memory cells. The memory cells in the array include the memory cell as disclosed herewith.

BRIEF DESCRIPTION OF THE DRAWINGS

FIGS. 3-6 illustrate steps in a fabrication sequence for manufacturing the cross-point array of memory cells as illustrated in FIGS. 2A-2B.

DETAILED DESCRIPTION

Figure 1:
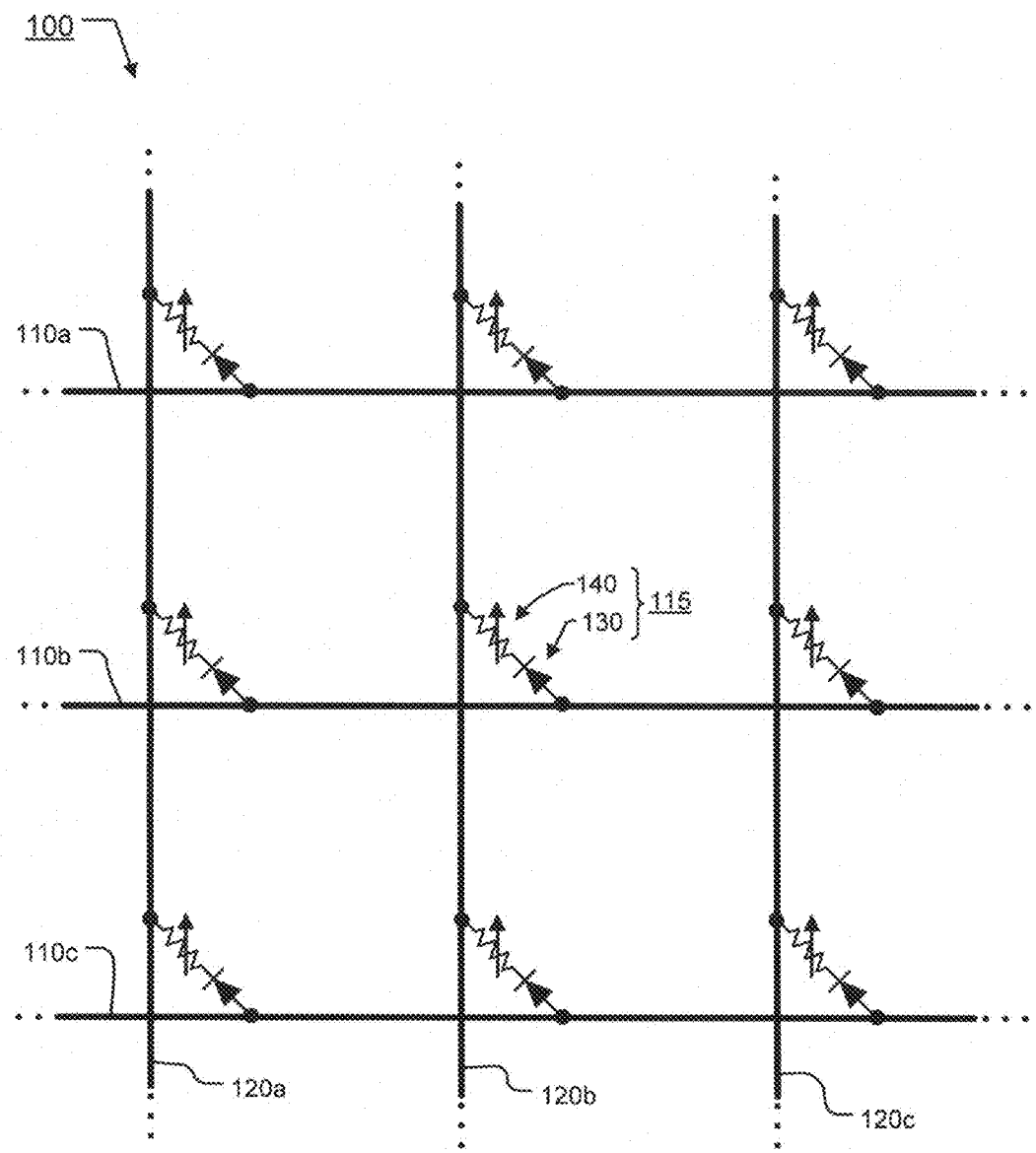
FIG. 1 illustrates a schematic diagram of a portion of a cross-point memory array implemented using memory cells as described herein.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a cross-point memory array 100 implemented using memory cells as described herein, each memory cell comprising a diode access device and a metal-oxide based memory element.

As shown in the schematic diagram of FIG. 1, each of the memory cells of the array 100 include a diode access device and a metal-oxide based memory element (each represented in FIG. 1 by a variable resistor) arranged in series in a current path between a corresponding word line 110 and a corresponding bit line 120. As described in more detail below, the memory element in a given memory cell is programmable to plurality of resistance states including a first and a second resistance state.

The array comprises a plurality of word lines 110 including word lines 110a, 110b, and 110c extending in parallel in a first direction, and a plurality of bit lines 120 including bit lines 120a, 120b, and 120c extending in parallel in a second direction perpendicular to the first direction. The array 100 is referred to as a cross-point array because the word lines 110 and bit lines 120 cross each other but do not physically intersect, and the memory cells are located at these cross-point locations of the word lines 110 and bit lines 120.

Memory cell 115 is representative of the memory cells of array 100 and is arranged at the cross-point location of the word line 110b and the bit line 120b, the memory cell 115 comprising a diode 130 and a memory element 140 arranged in series. The diode 140 is electrically coupled to the word line 110b and the memory element 140 is electrically coupled to the bit line 120b.

Reading or writing to memory cell 115 of array 100 can be achieved by applying appropriate voltage pulses to the corresponding word line 110b and bit line 120b to induce a current through the selected memory cell 115. The level and duration of the voltages applied is dependent upon the operation performed, e.g. a reading operation or a programming operation.

Figure 9:
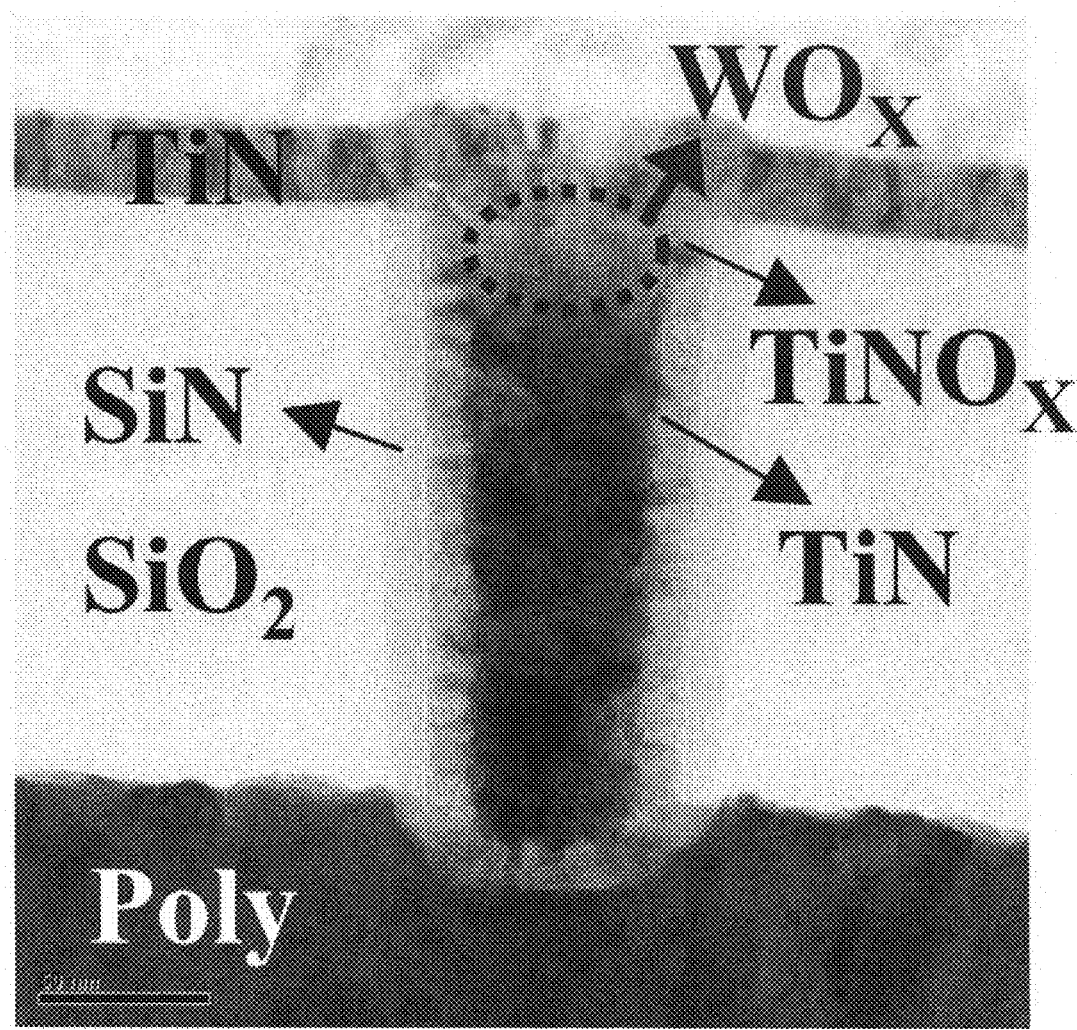
FIG. 9 is a cross-sectional TEM image of an example memory cell with an electrical field enhancement arrangement.

In a read (or sense) operation of the data value stored in the memory cell 115, bias circuitry (See, for example, biasing arrangement supply voltages, current sources 36 of FIG. 9) coupled to the corresponding word line 110b and bit line 120b to apply bias arrangements across the memory cell 115 of suitable amplitude and duration to induce current to flow which does not result in the memory element 140 undergoing a change in resistive state. The current through the memory cell 115 is dependant upon the resistance of the memory element 140 and thus the data value stored in the memory cell 115. The data value may be determined, for example, by comparison of the current on the bit line 120b with a suitable reference current by sense amplifiers (See, for example, sense amplifiers/data in structures 24 of FIG. 9).

In a program operation of a data value to be stored in the memory cell 115, bias circuitry (See, for example, biasing arrangement supply voltages, current sources 36 of FIG. 9) coupled to the corresponding word line 110b and bit line 120b to apply bias arrangements across the memory cell 115 of suitable amplitude and duration to induce a programmable change in the memory elements 140 to store the data value in the memory cell 115, the electrical resistance of the memory element 140 corresponding to the data value stored in the memory cell 115.

The bias arrangements include a first bias arrangement sufficient to forward bias the diode 130 and change the resistance state of the memory element 140 from a resistance corresponding to a first programmed state to a resistance corresponding to a second programmed state. The bias arrangements also include a second bias arrangement sufficient to forward bias the diode 130 and change the resistance state of the memory element 140 from a resistance corresponding to the second programmed state to a resistance corresponding to the first programmed state. In embodiments the bias arrangements for unipolar operation of the memory element 140 may each comprise one or more voltage pulses, and the voltage levels and pulse times can be determined empirically for each embodiment.

Figure 2A:
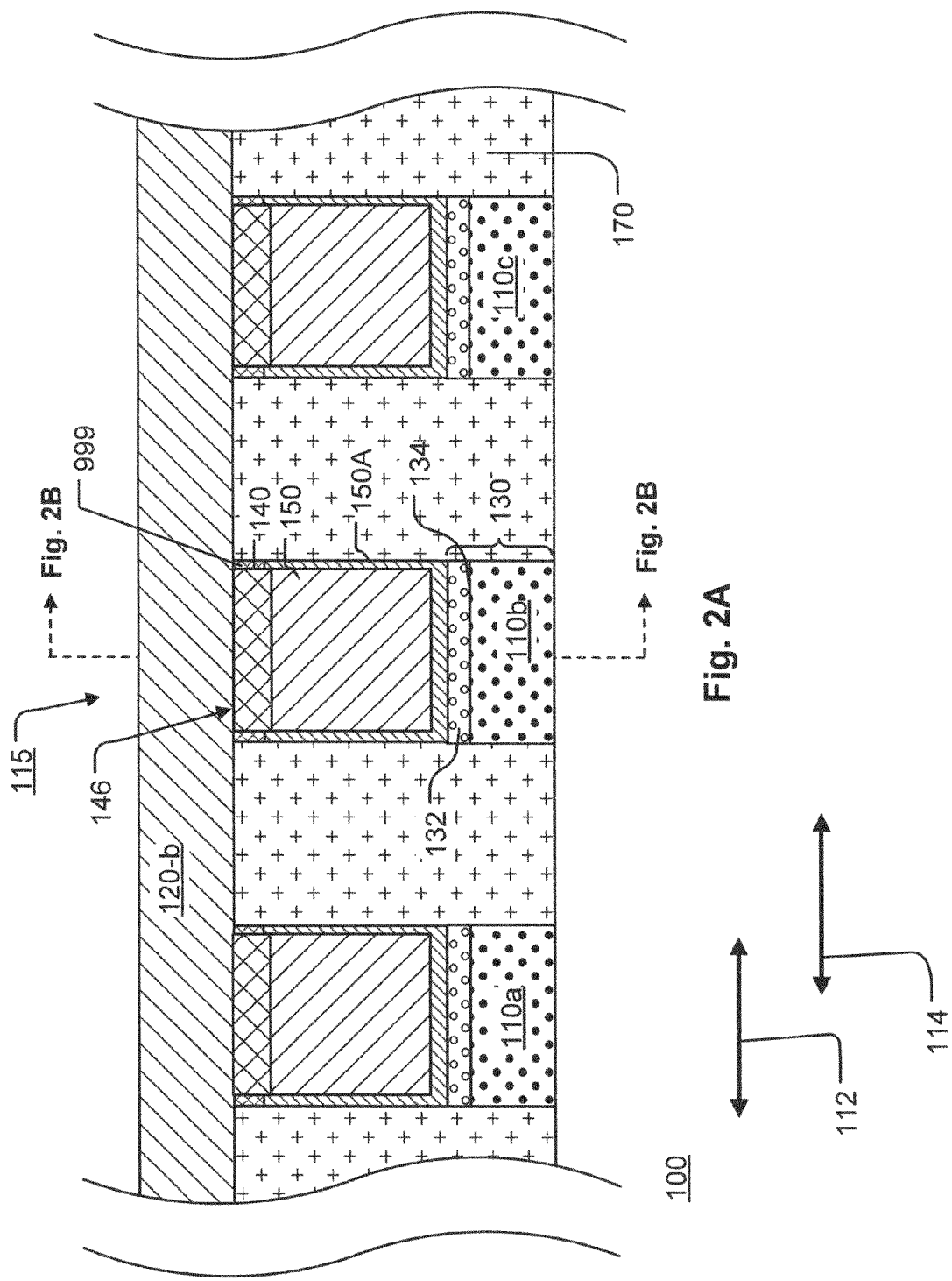
FIGS. 2A and 2B illustrates cross-sectional views of a portion of an embodiment of memory cells arranged in the cross point array.
Figure 2B:
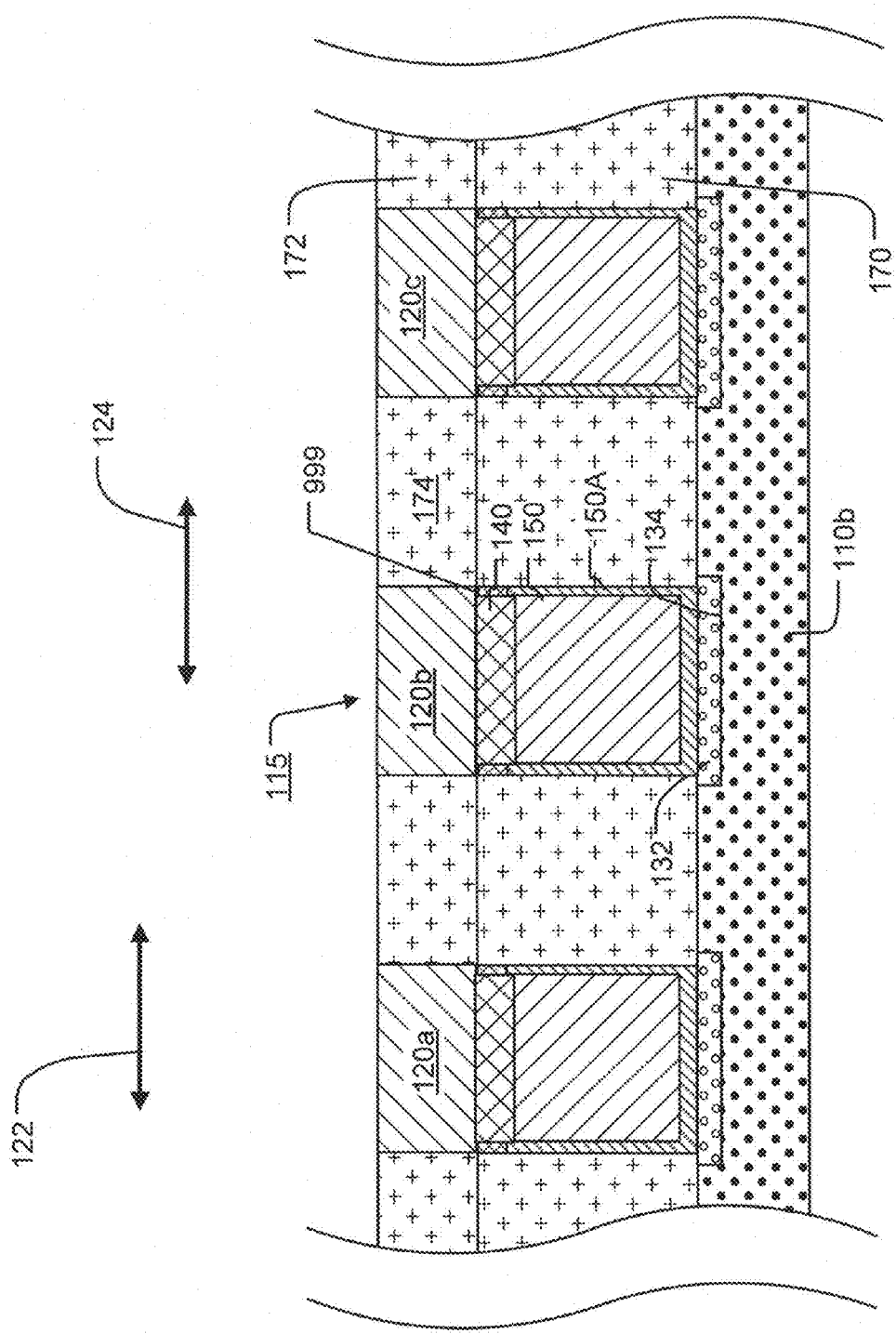
Figure 5B:
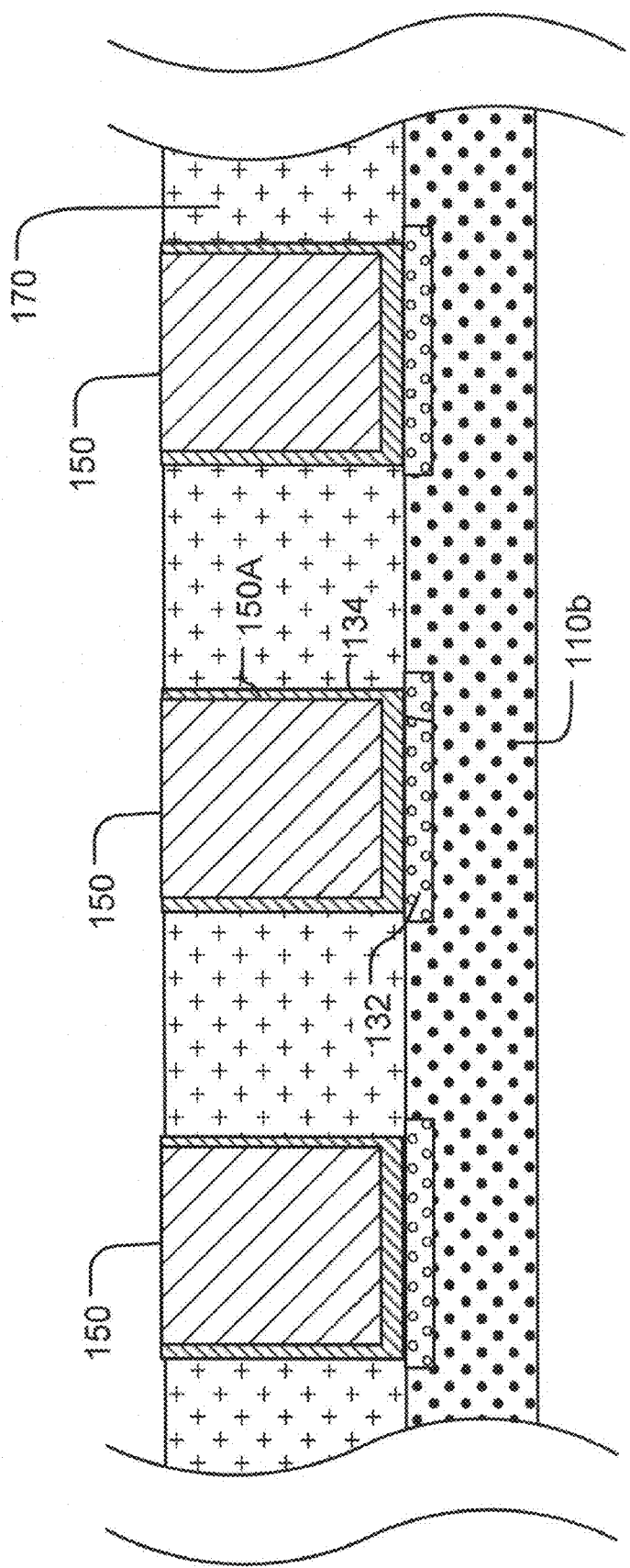

FIGS. 2A and 2B illustrate cross-sectional views of a portion of an embodiment of memory cells (including representative memory cell 115) arranged in the cross-point array 100, FIG. 2A taken along the bit lines 120 and FIG. 5B taken along the word lines 110.

Referring to FIGS. 2A and 2B, the memory cell 115 includes a doped semiconductor region 132 within the word line 110b. The word lines 110 comprise doped semiconductor material having a conductivity type opposite that of the doped semiconductor region 132. Thus, the doped semiconductor region 132 and the word line 110b define a pn junction 134 therebetween, and the diode 130 comprises the doped semiconductor region 132 and a portion of the word line 110b adjacent the doped semiconductor region 132. In the illustrated embodiment the word lines 110 comprise doped P-type semiconductor material such as polysilicon, and the doped semiconductor region 132 comprises doped N-type semiconductor material.

In an alternative embodiment the word lines 130 may comprise other conductive materials such as W, TiN, TaN, Al and the diode may be formed by first and second doped regions having different conductivity types on the word lines 110. In yet another alternative embodiment, the diode may be formed by a lightly doped region between more highly doped regions of opposite conductivity since it has been observed that the breakdown voltage of the diode can be improved.

The memory cell 115 includes a conductive element 150 extending through dielectric 170 to couple the diode 130 to memory element 140.

In the illustrated embodiment the conductive element 150 comprises tungsten and the memory element 140 comprise tungsten-oxide $WO_x$. The memory element 140 is surrounded by a layer 150A of TiN or a bi-layer of silicon nitride and TiN. Other materials can be used for the liner as well.

Embodiments for forming the memory element 140 in the illustrated embodiment comprising tungsten-oxide include direct plasma oxidation, down-stream plasma oxidation, thermal diffusion oxidation, sputtering, and reactive sputtering. Embodiments of the plasma oxidation process include a pure $O_2$ gas chemistry, or mix chemistries such as $O_2/N_2$, or $O_2N_2/H_2$. In one embodiment of the down-stream plasma, the down-stream plasma is applied with a pressure of about 1500 mtorr, a power of about 1000 W, the rate of $O_2/N_2$ flow ranging from 0.1 to 100, a temperature of about 150° C., and a time duration ranging from 10 to 2000 seconds. See, for example, U.S. patent application Ser. No. 11/955,137, which is incorporated by reference herein. This process also causes oxidation of the top portions of the layer 150A, to form a field enhancement element 999 comprising $TiNO_X$ surrounding the memory element at the level at which contact to the top electrode is made. The WOX forms in a way that results in a thicker layer than the thickness of the TiNOx layer. As a result, the thickness of the dielectric between the top electrode and the top of the liner surrounding the tungsten plug, is less than the thickness of the dielectric through the memory element to the top of the tungsten plug. As a result of this shorter distance, the electric field between the top electrode and the liner is greater than that between the top electrode and the surface of the tungsten plug. Also, the field intensity in the upper portion of the $WO_x$ is enhanced. When the diameter of the tungsten plug, that is the inside diameter of the liner, is on the order of about 20 nsec or less for an applied voltage on the order of 1.5 volts, the enhance field becomes substantially uniformly enhance across the entire cross-section of the memory element.

In alternative embodiments the memory element 140 may comprise one or more metal oxides from the group of titanium oxide, nickel oxide, aluminum oxide, copper oxide, zirconium oxide, titanium nickel oxide, strontium zirconium oxide, NbO, TaO, Cr-doped SrZrO3, Cr-doped SrTiO3, PCMO, LaCaMnO, a transition metal oxides etc. The field enhancement element can be materials, such as SiO2, HfOx, TiNOx, TiOx, AlOx, WOx, etc, preferably chosen so that they have a higher resistance than the memory element 140.

The bit lines 120, including bit line 120b acting as a top electrode for the memory cell 115, are electrically coupled to the memory elements 140 and extend into and out of the cross-section illustrated in FIG. 5B. The bit lines 120 comprise one or more layers of conductive material. The bit lines 120 may comprise Ni or Pt or other high work function conducting materials. Also, the top and bottom electrodes and conductors can be TiN, Yb, Tb, Y, La, Sc, Hf, Zr, Al, Ta, Ti, Nb, Cr, V, Zn, W, Mo, Cu, Re, Ru, Co, Ni, Rh, Pd, Pt, etc. A high work function electrode reduces the switching current of an operation. For example, with Ni, at 60 nm the operating current is reduced to <100 uA with switching speed of <50 ns. An extremely long retention of >300 years at 85 degrees C. is predicted. Also, a top electrode with similar free energy of formation improves retention properties.

Dielectric 174 separates adjacent bit lines 120. In the illustrated embodiment the dielectrics 170, 172 comprise silicon oxide. Alternatively, other dielectric materials may be used.

As can be seen in the cross-sections illustrated in FIGS. 2A and 2B, the memory cells of the array 100 are arranged at the cross-point locations of the word lines 110 and bit lines 120. Memory cell 115 is representative and is arranged at the cross-point location of word line 110b and bit line 120b. Additionally, the memory elements 140 and conductive elements 150, 160 have a first width substantially the same as the width 114 of the word lines 110 (See FIG. 2A). Furthermore, the memory elements 140 and conductive elements 150, 160 have a second width substantially the same as the width 124 of the bit lines 120 (See FIG. 2B). As used herein, the term "substantially" is intended to accommodate manufacturing tolerances. Therefore, the cross-sectional area of the memory cells of array 100 is determined entirely by dimensions of the word lines 110 and bit lines 120, allowing for a high memory density for array 100.

The word lines 110 have word line widths 114 and are separated from adjacent word lines 110 by a word line separation distance 112 (See FIG. 2A), and the bit lines 120 have bit line widths 124 and are separated from adjacent bit lines 120 by a bit line separation distance 122 (See FIG. 2B). In preferred embodiments the sum of the word line width 114 and the word line separation distance 112 is equal to twice a feature size F of a process used to form the array 100, and the sum of the bit line width 124 and the bit line separation distance 122 is equal to twice the feature size F. Additionally, F is preferably a minimum feature size for a process (typically a lithographic process) used to form the bit lines 120 and word lines 110, such that the memory cells of array 100 have a memory cell area of $4F^2$.

In the memory array 100 illustrated in FIGS. 2A-2B, the memory element 140 is self-aligned with the conductive plug 150. In the manufacturing embodiment described in more detail below, the memory element 140 is formed by oxidation of the material of the conductive element 150.

In operation, bias circuitry (See, for example, biasing arrangement supply voltages, current sources 36 of FIG. 9) coupled to the corresponding word line 110b and bit line 120b applies bias arrangements across the memory cell 115 to forward bias the diode 130 and induce a programmable change in the resistance state of the memory element 140, the electrical resistance of the memory element 140 indicating the data value stored in the memory cell 115.

FIGS. 3-6 illustrate steps in a fabrication sequence for manufacturing the cross-point array 100 of memory cells as illustrated in FIGS. 2A-2B.

FIGS. 3A-3B illustrate cross-sectional views of a first step of forming word lines 110 on a substrate and dielectric 170 on the word lines 110. The word lines 110 extend in a first direction into and out of the cross-section illustrated in FIG. 3A, and in the illustrated embodiment comprise doped semiconductor material. The word lines 110 have word line width 114 and adjacent word lines are separated by word line separation distance 112.

Figure 4A:
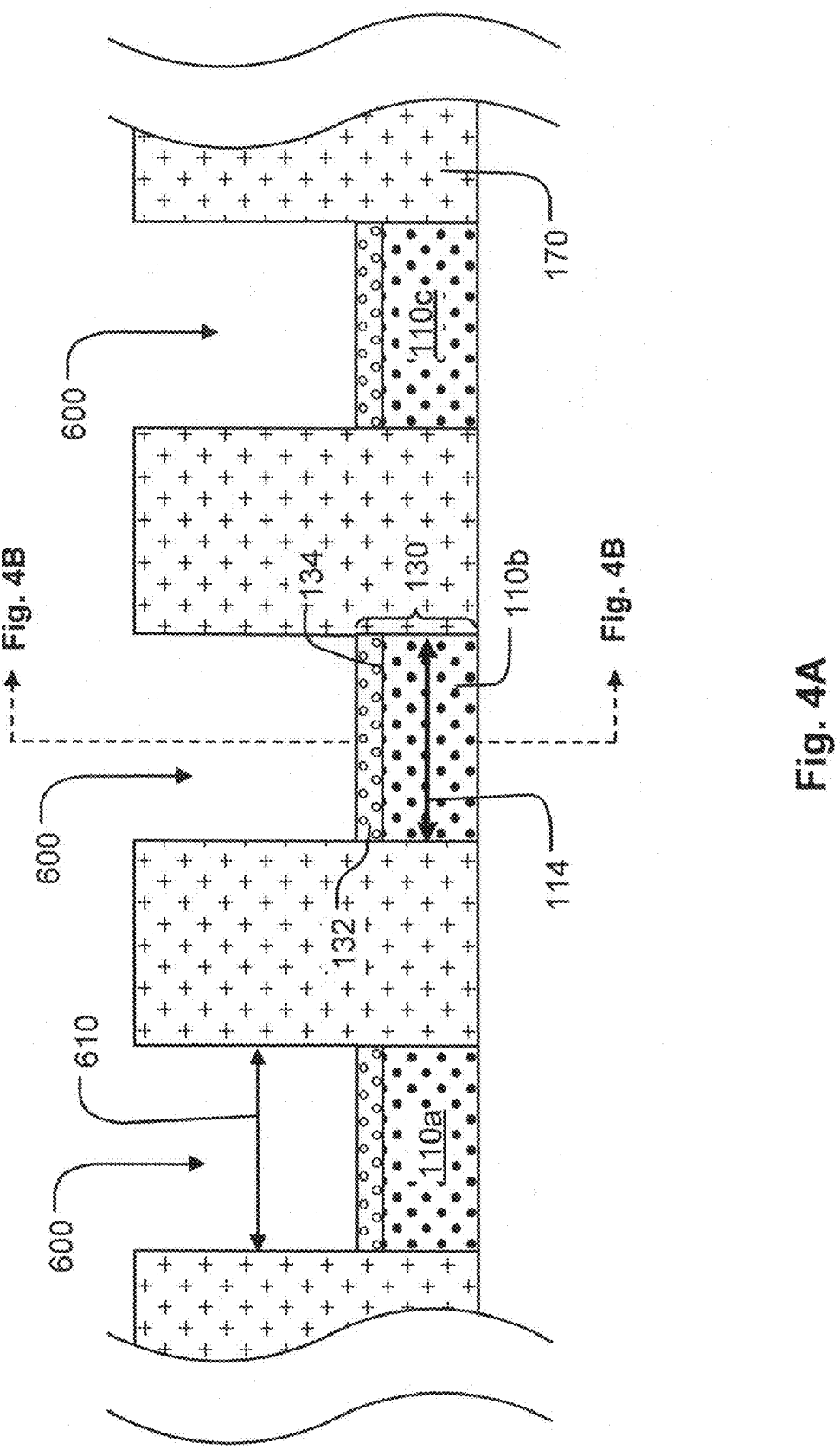
Figure 4B:
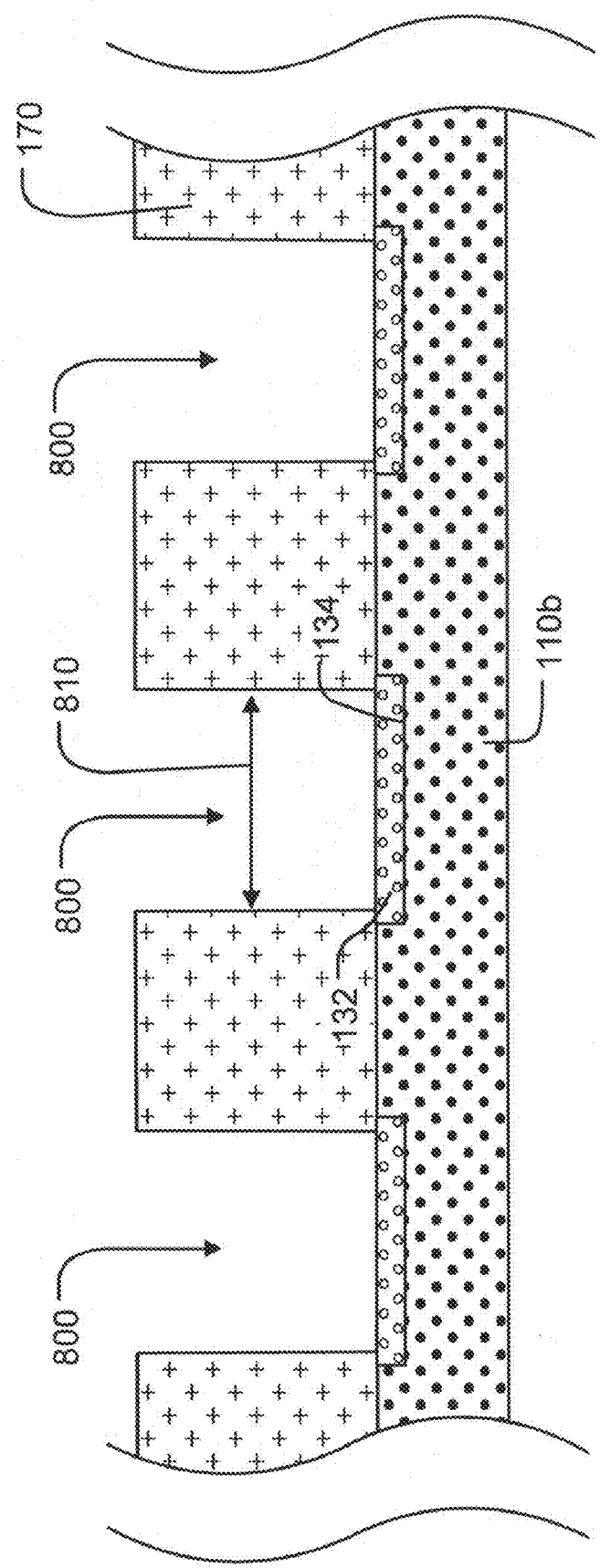

Next, an array of vias 600 having width 610 are formed in the dielectric 170 to expose portions of the word lines 110, and the doped semiconductor regions 132 are formed within the word lines 110, for example by ion implantation, resulting in the structure illustrated in the cross-sectional views of FIGS. 4A-4B. The doped semiconductor regions 132 have a conductivity type opposite that of the word lines 110. Thus the doped semiconductor regions 132 and word lines 110 define pn junctions 134, and the diode 130 comprises the doped semiconductor regions 132 and a portion of the word line 110 adjacent the doped semiconductor regions 132.

Next, conductive elements 150 are formed within the vias 600 of FIGS. 4A-4B, resulting in the structure illustrated in the cross-sectional views of FIGS. 5A-5B. The conductive elements 150 in the illustrated embodiment comprise tungsten material and can be formed within the vias 600 by Chemical Vapor Deposition CVD of tungsten material, followed by a planarization step such as Chemical Mechanical Polishing CMP.

Figure 6B:
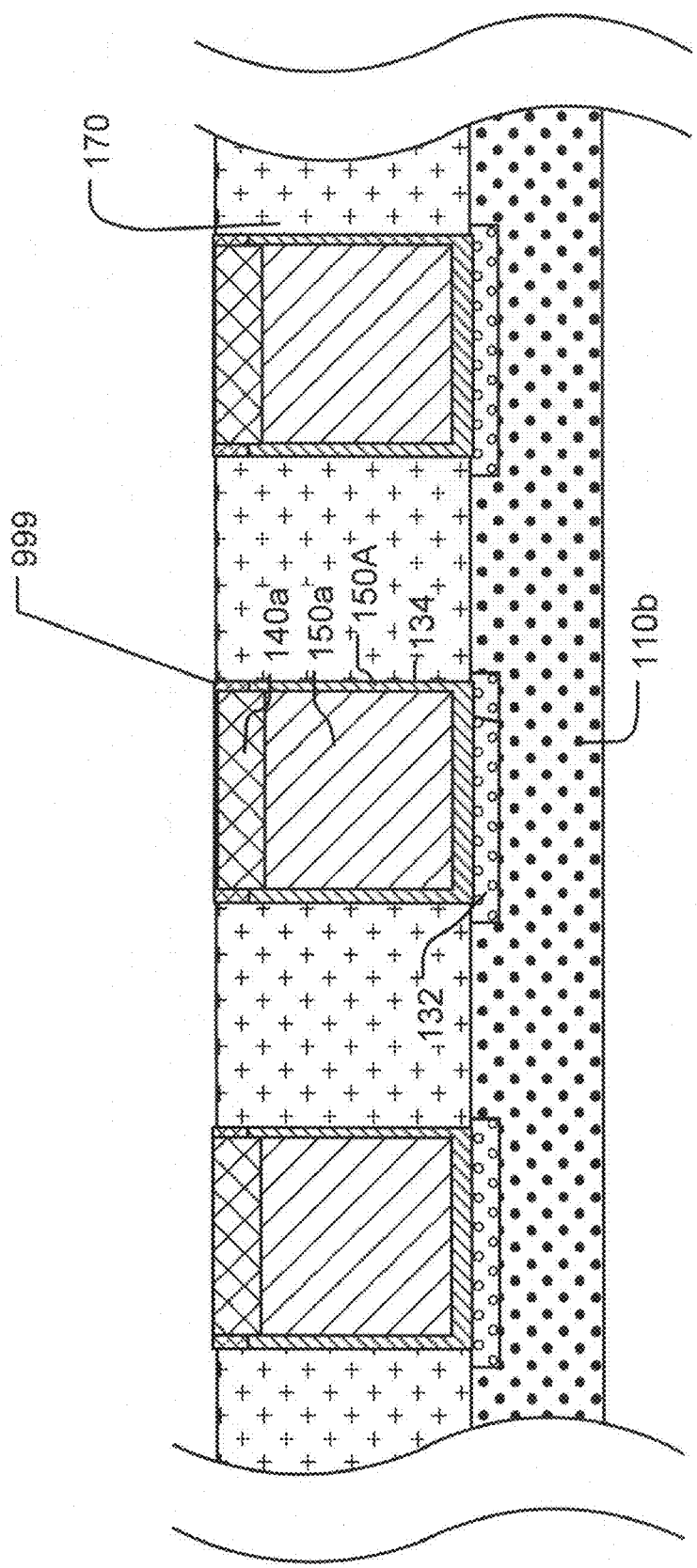

Next, oxidation of a portion of the conductive elements 150 and the liner 150A forms memory elements 140 and field enhancement elements 999 self-aligned with the remaining portion of the corresponding conductive elements 150 and liners 150A, resulting in the structure illustrated in the cross-sectional views of FIGS. 6A and 6B. The oxidation can comprise plasma oxidation and an optional thermal oxidation step. For example, direct oxygen plasma oxidation or downstream oxygen plasma oxidation may be used. Embodiments include pure $O_2$ gas chemistry, or mixed chemistries such as $O_2/N_2$ or $O_2/N_2/H_2$. Since the memory elements 140 are formed by oxidation of the conductive elements 150, no additional masks are necessary to form the memory elements 140.

Next, the metal-oxide memory element 140 is optionally cured by exposing the metal-oxide memory element 140 to a gas comprising at least one of nitrogen, hydrogen, and argon, at a temperature greater than 100 degrees Celsius. More preferably the metal-oxide memory element 140 is exposed to the gas at a temperature greater than 150 degrees Celsius. Exposing the metal-oxide memory element 140 to the gas can be carried out using any suitable high temperature system including, for example, a furnace system or a rapid thermal pulse ("RTP" system). The time, temperature, and the pressure of the exposure process will depend on a number of factors, including the system used, and will vary from embodiment to embodiment. For example, the temperature can range from 150 degrees C. to 500 degrees C. with a time of 10 to 10,000 seconds, at a pressure of between $10^{-5}$ and $10^{-2}$ torr. As discussed in more detail below with respect to FIGS. 11A-11B, curing the metal-oxide memory element as described herein is shown to improve the resistive switching performance and the cycle endurance of the metal-oxide memory element 140.

Next, high work function bit lines 130 formed using for example physical vapor deposition processes, separated by dielectric 174, are formed on the structure illustrated in FIGS. 6A-6B, resulting in the cross-point array 100 illustrated in FIGS. 2A-2B. In some embodiments, the optional exposure process of the memory element 140 as discussed above with respect to FIGS. 4A-4B is instead performed on the bit lines 130. Bias circuitry such as supply voltages and/or current sources can be formed on the same device as the memory elements and coupled to the word lines 110 and bit lines 120 for applying bias arrangements as described herein. The bit lines 130 and dielectric 174 may be formed by patterning a bit line material on the structure in FIGS. 4A-4B, forming dielectric on the bit lines 130, and performing a planarizing process such as Chemical Mechanical Polishing CMP.

Subsequent to FIG. 6B, a top electrode is formed, with a conductor.

Figure 7:
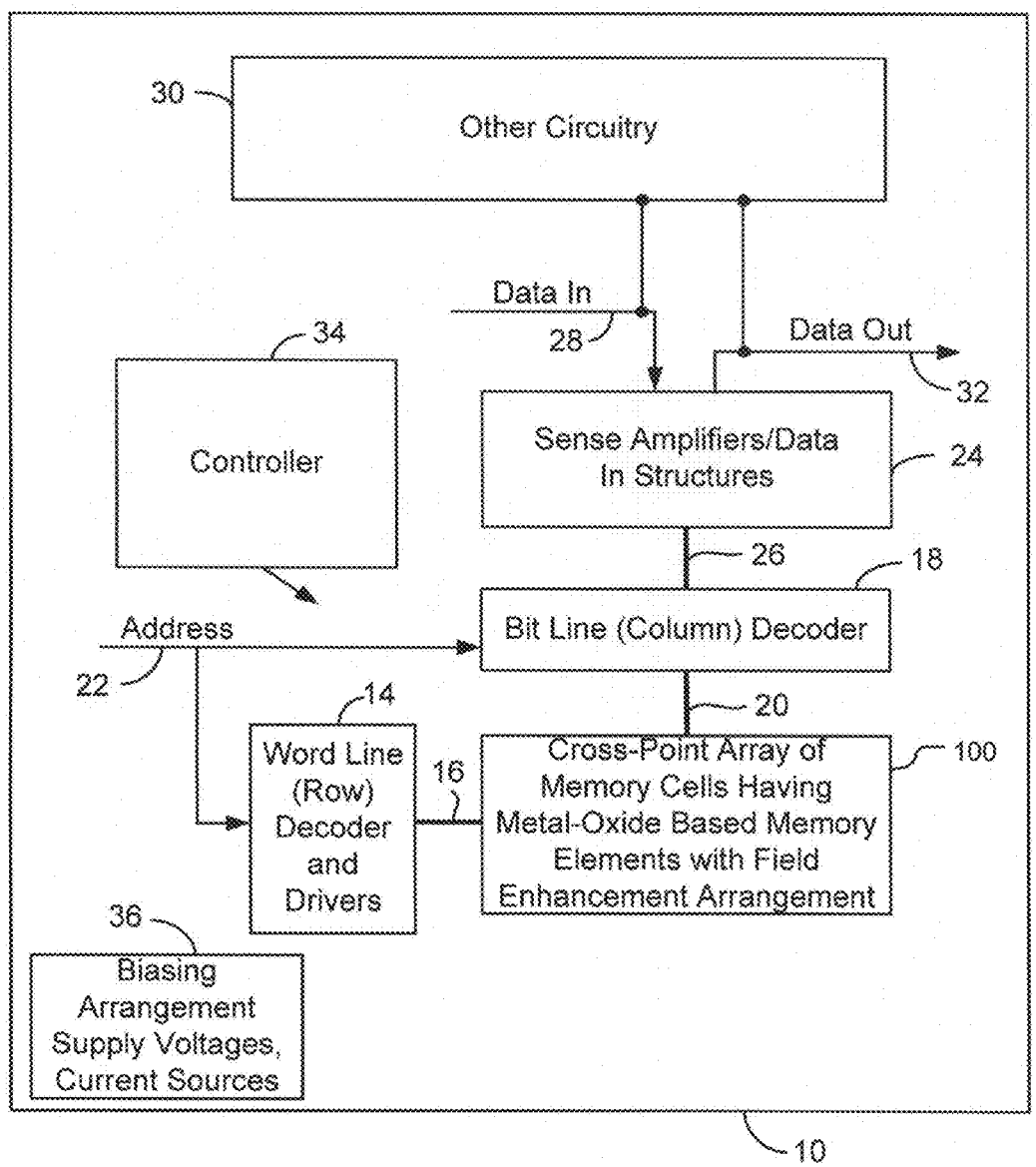
FIG. 7 is a simplified block diagram of an integrated circuit including a cross-point array of memory cells having a metal-oxide based memory element and a diode access device as described herein.

FIG. 7 is a simplified block diagram of an integrated circuit 10 including a cross-point memory array 100 of memory cells having a metal-oxide based memory element and a diode access device as described herein. A word line decoder 14 is coupled to and in electrical communication with a plurality of word lines 16. A bit line (column) decoder 18 is in electrical communication with a plurality of bit lines 20 to read data from, and write data to, the memory cells (not shown) in array 100. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

As described above with respect to FIGS. 6A-6B, during manufacturing of memory cells with diode access devices, the metal-oxide memory element 140 can be cured by exposing the metal-oxide memory element to a gas comprising at least one of nitrogen, hydrogen, and argon.

Other metal-oxides such as titanium oxide, nickel oxide, aluminum oxide, copper oxide, zirconium oxide, niobium oxide, tantalum oxide, titanium-nickel oxide, Cr doped $SrZrO_3$, Cr doped $SrTiO_3$, PCMO, and LaCaMnO can be utilized with high work function top electrode materials.

This device not can use bipolar operation but use unipolar operation. Bipolar operation means the device can be operated by opposite polarity electrical field to SET or RESET. Unipolar operation means the device can be operated by same polarity electrical field to SET or RESET.

Figure 8:
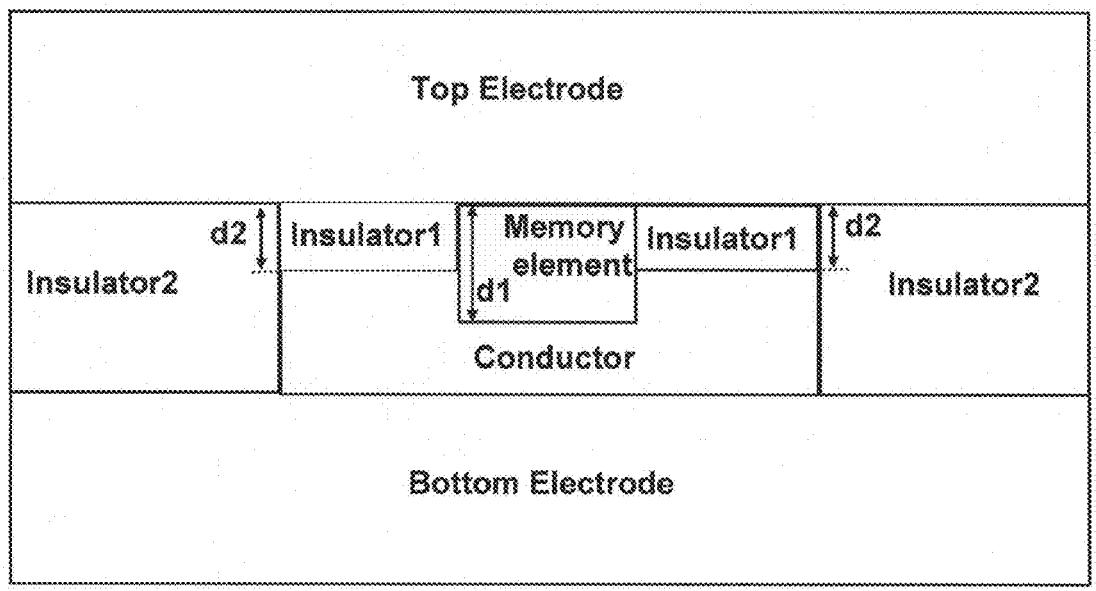
FIG. 8 is a simplified diagram of an example memory cell with an electrical field enhancement arrangement.

FIG. 8 is a simplified diagram of an example memory cell with an electrical field enhancement arrangement.

A memory such as an oxide resistive RAM or a magnetic tunnel junction magnetoresistive RAM has a field enhancing arrangement. The memory cell has a top electrode and a bottom electrode, and a memory element arranged in electrical series in the current path between the top electrode and the bottom electrode.

Also in electrical series in the current path between the top electrode and the bottom electrode, a conductive element or conductor has a cross-sectional "U" shape. The recessed portion of the cross-sectional "U" shape of the conductive element is at a first distance d1 from the top electrode, corresponding to the thickness d1 of the memory element. The arm portions of the cross-sectional "U" shape of the conductive element are at a second distance d2 from the top electrode, corresponding to the thickness d2 of the nonconductive insulator 1 surrounding the memory element. As to the distances from the top electrode, d1 is the first distance from the top electrode to the recessed portion of the cross-sectional "U" shape of the conductive element, and d2 is the second distance from the top electrode to the arm portions of the cross-sectional "U" shape of the conductive element, and d1 is larger than d2. A nonconductive insulator 2 surrounds the conductive element and the nonconductive insulator1.

Insulator1 and Insulator2 can be the same or different materials. The thin insulator1 will induce the electrical field into the memory cell as size (diameter) scales to smaller and smaller sizes. So, the material requirement of the insulator1 is a high resistance material like SiO2 or TiNOx, which can support a high electrical field within insulator1. To cause field enhancement, the thickness d2 is less than d1.

The thinner the insulator1 and the narrower the width of the memory element, the higher the electrical field that is generated at the end of insulator1 and within the memory element.

FIG. 9 is a cross-sectional TEM image of an example memory cell with an electrical field enhancement arrangement.

In FIG. 9, the TEM image of the 60 nm device features the metal oxide TiNOx as the memory element. A top part of the memory element is surrounded by the nonconductive insulator TiNOx. The conductive element is a combination of (i) the conductive tungsten W plug and (ii) the conductive TiN liner which surrounds the bottom part of the memory element and the conductive tungsten W plug. In this embodiment, a self-aligned field enhanced device arrangement is formed by oxidizing the TiN liner into an insulating TiNOx, such that the WOx is forced to protrude above the remaining TiN liner.

A WOx ReRAM has excellent compatibility to CMOS and has a simple process. However, unlike other transition metal oxides WOx exhibits a low initial resistance that draws high current and this seriously limits its writing bandwidth.

WOx differs from other transition metal oxide (TMO) RRAM. Due to temperature limitations, the RTO process does not completely eliminate tungsten-sub-oxides that form leakage paths in the virgin WOx RRAM element. A forming process changes the low resistance state to a high resistance state. This operation requires high voltage/current and requires correct polarity; reversed polarity of the forming pulse does not achieve a high resistance state.

X-ray photoelectron spectroscopy (XPS) analysis of WOx RRAM indicates that the top layers of the WOx RRAM surface are composed of mainly $WO_3$, and the composition changes to a mixture of $WO_2+W_2O_5+WO_3$ about 2.5 nm below the surface. Conductive atomic force microscopy (C-AFM) shows leakage paths that can be eliminated by applying a current through the AFM tip, suggesting that the leakage paths are sealed by oxidation caused by Joule heating.

In a proposed mechanism for the forming process, a positive voltage draws negative $O^{2-}$ ions from further below the surface, and converts the leaky sub-oxides into insulating $WO_3$. The top electrode is oxygen-inert. The following table shows that an oxygen-inert top electrode (TiN, Pt) shows better ReRAM HRS/LRS ratio than an oxygen reactive top electrode (Al, Ti, W):

|  | Resistance Window |
| --- | --- |
| TiN/WOx | 5 KΩ-100 KΩ |
| Pt/WOx | 5 KΩ-1 MΩ |
| Al/WOx | No switching |
| Ti/WOx | 0.3 KΩ-3 KΩ |
| W/WOx | 0.2 KΩ-1 KΩ |

The SET/RESET mechanisms are described. For SET operation, one or more $WO_{3-n}$ filaments are created, bridging the top and bottom electrodes, through electrochemical reduction-oxidation reaction. The conductive $WO_{3-n}$ layer produces the low resistance state. For RESET operation, the $WO_{3-n}$ filament is ruptured and turned into an insulating $WO_3$ by the same mechanism of the forming process. (Oxidized by $O^{2-}$ drawn from deeper below.) Therefore, the initial forming is just a special RESET on the raw device with a larger number of leakage paths.

The resistance determining layers are near the top WOx surface. Accordingly, the fully sealed $WO_3$ is achieved with a regular RESET pulse. Applying SET/RESET voltage and current for devices of various sizes (60 nm, 80 nm, 100 nm) shows that both RESET and SET V/I show no or weak dependence on the device size, suggesting that the RESET and SET mechanisms of WOx RRAM is dominated by the formation and disruption of filaments through a reduction-oxidation reaction process. The 50 ns reset pulse has a median reset voltage that remains at about 1.8 V, and a median reset current which drops from about 1.3 mA at 100 nm diameter, to about 0.8 mA at 80 nm and 60 nm diameters. The 50 ns set pulse has a median set voltage that remains at about −1.3 V, and a median set current which remains at about 0.65 mA.

The initial resistance distribution is compared for 50 fresh 180 nm WOx RRAM devices and 50 fresh 60 nm WOx RRAM devices. At 60 nm, the initial resistance is much higher with a wide distribution (log R between 3.8 and 6.5), while it is very tight for the 180 nm device (log R between 2.5 and 3.0). This may be interpreted by the density of leakage paths. If the leakage path density is such that it approaches single digit in a 60 nm×60 nm area then such a distribution is expected from statistical fluctuation.

Tight programming voltage distributions result for SET and RESET operations from 50 60 nm WOx RRAM cells. For reset (R about 100 kohm) the average voltage is 1.91 V with a standard deviation of 0.31 V, and for set (R about 10 kohm) the average voltage is 1.31 V with a standard deviation of 0.22 V Transient I-t curves show that the 50 ns RESET and SET pulses on a 60 nm WOx RRAM cell are well behaved. Multilevel cell (MLC) operation with a 60 nm WOx RRAM cell is achievable, with at least four levels, by creating two additional levels between 20Ω and 80 KΩ, and the MLC endurance is >$10^4$ cycles. Excellent read disturb immunity of >$10^9$ read times exists, with generally level reset state of about $1.5×10^5$ ohms at 0.25 V, generally level set state of about $2.0×10^5$ ohms at 0.5 V, $7.5×10^3$ ohms at 0.25 V, generally level set state of about $7.5×10^3$ ohms at 0.5 V.

Figure 10:
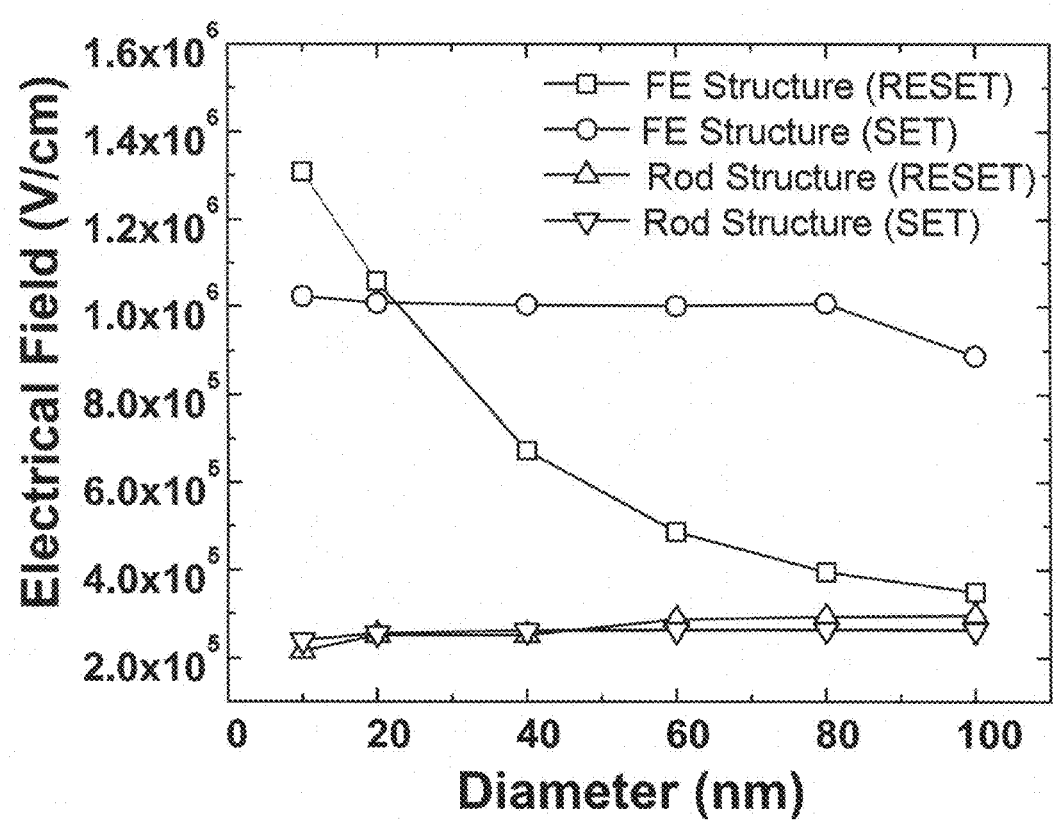
FIG. 10 is a graph of electrical field at the center versus memory cell diameter from simulations of reset and set operations with example memory cells, both with and without an electrical field enhancement arrangement.

FIG. 10 is a graph of electrical field at the center versus memory cell diameter from simulations of reset and set operations with example memory cells, both with and without an electrical field enhancement arrangement.

The example memory cells without the electrical field enhancement arrangement are referred to as a rod structure. In the rod structure, the conductive element lacks a cross-sectional "U" shape, and instead has a simple rectangular shaped cross-section of a plug.

The example memory cells without the electrical field enhancement arrangement are referred to as the FE (field enhanced) structure. Because the tips of the two arms of the cross-sectional "U" shape of the conductive element are much closer to the top electrode, a given voltage difference between the top electrode and the conductive element (e.g., sharing the voltage of the bottom electrode) has much less distance to change compared to the rod structure; accordingly, the electric field (according to E=V/d) is much higher with the electrical field enhancement arrangement, proximate to the tips of the two arms of the cross-sectional "U" shape of the conductive element.

The electric field at the center of the WOx is significantly higher when the size of the W plug scales downward. The field near the edge is even higher. This field enhancement feature is self-aligned within the W plug structure without the cost of any additional mask.

Figure 11:
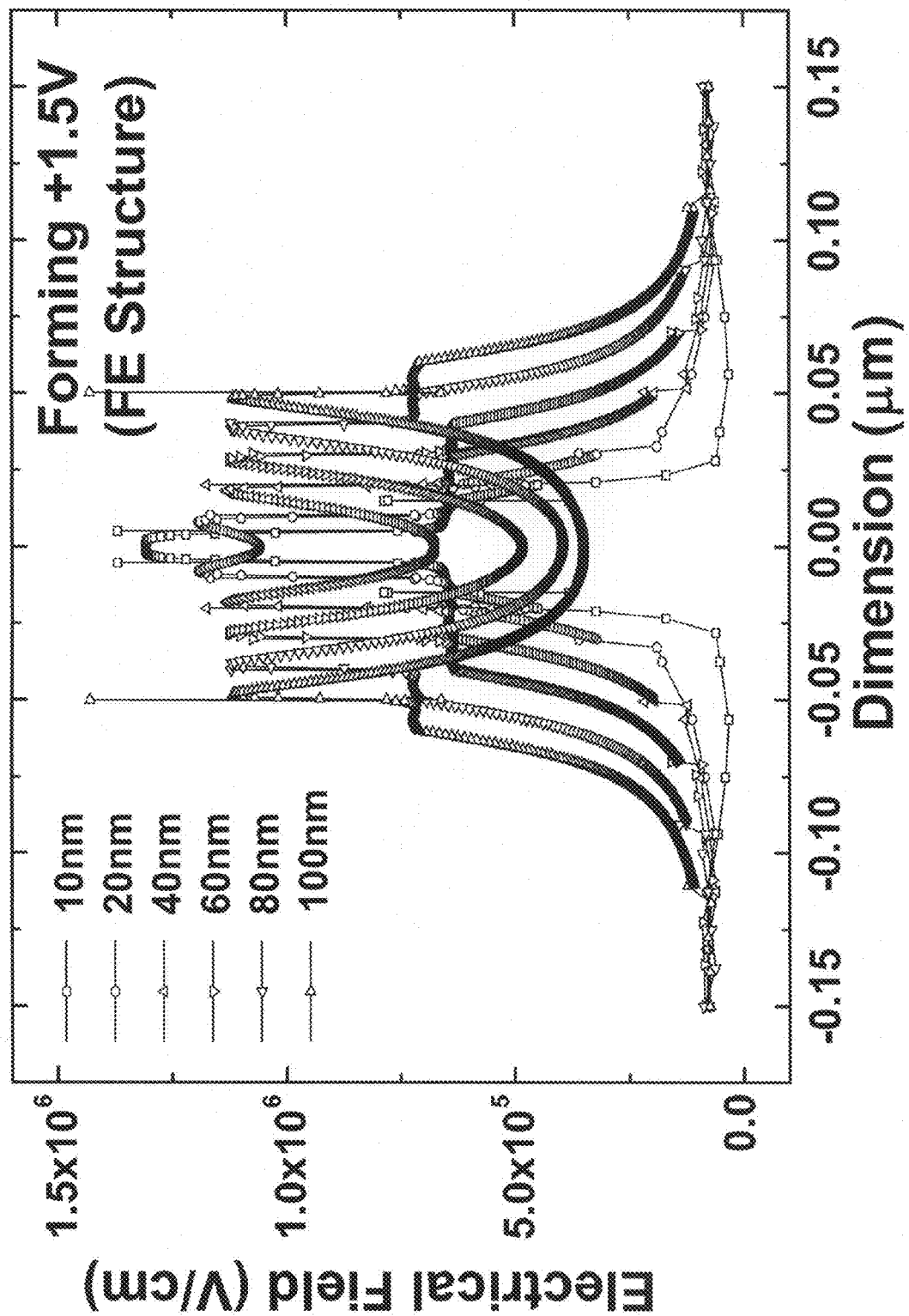
FIG. 11 is a graph of electrical field in cross-section from simulations of various diameter example memory cells with an electrical field enhancement arrangement undergoing a forming operation.

FIG. 11 is a graph of electrical field in cross-section from simulations of various diameter example memory cells with an electrical field enhancement arrangement undergoing a forming operation.

FIG. 11 shows field intensity versus distance from the center of the memory element, for memory elements having diameters from 10 nm to 100 nm. The data shows that the field is enhanced substantially, with increasing uniformity across the memory element as the size reaches about 20 nm, for an applied voltage of 1.5 volts.

The various diameters of the memory cells range from 100 nm, 80 nm, 60 nm, 40 nm, 20 nm, and 10 nm. The graph is centered about the center of the memory cell. FIG. 11 indicates that, as the size of the plug scales downward, the two arms of the cross-sectional "U" shape of the conductive element become closer, and the high electric fields, proximate to the ends of the two arms of the cross-sectional "U" shape of the conductive element, increasingly converge at the center. The lateral position of the high electric fields corresponds to the radius (half the diameter) of the memory cell.

Figure 12:
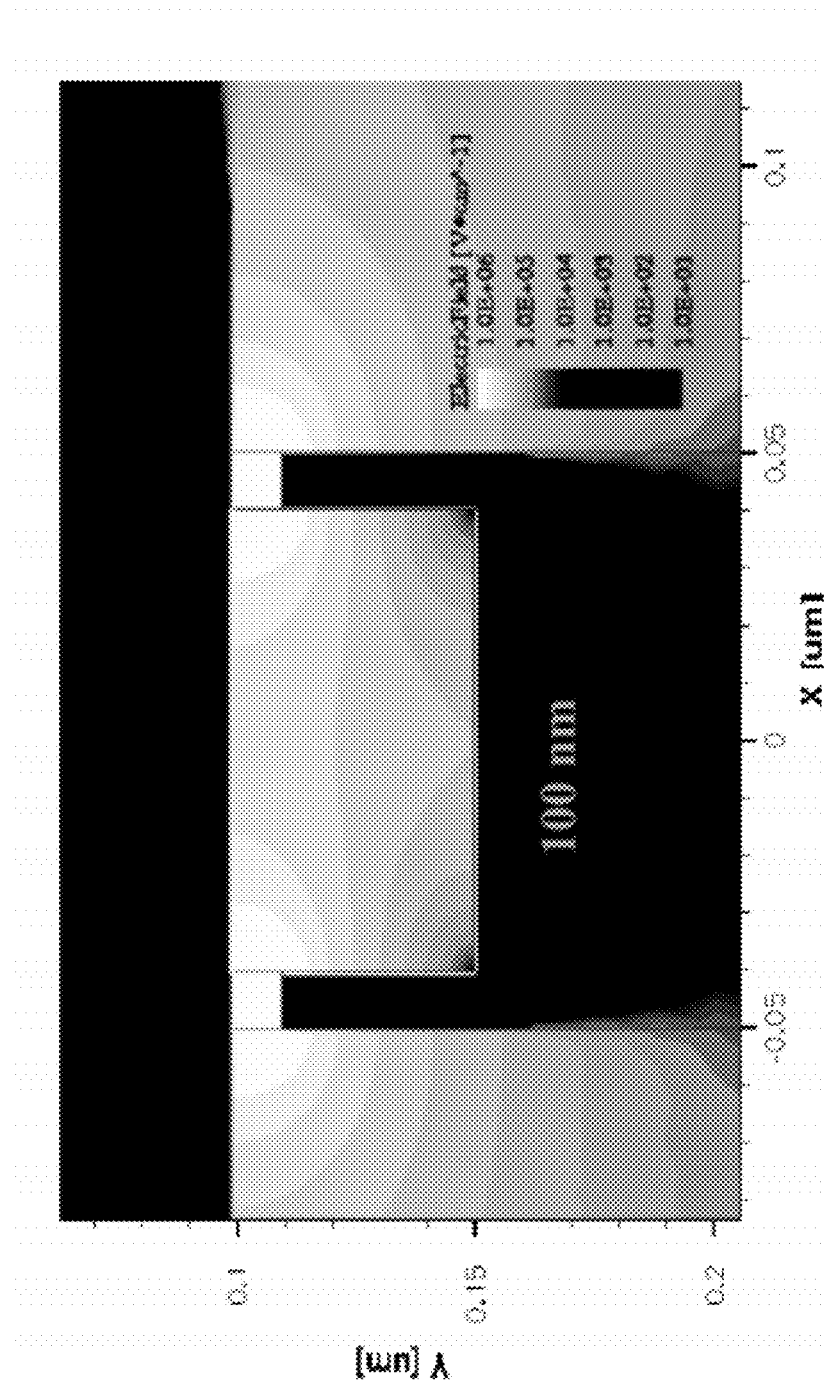
FIG. 12 is a two-dimensional graph of electrical field from simulation of the 100 nm diameter example memory cell with an electrical field enhancement arrangement.

FIG. 12 is a two-dimensional graph of electrical field from simulation of the 100 nm diameter example memory cell with an electrical field enhancement arrangement.

Figure 13:
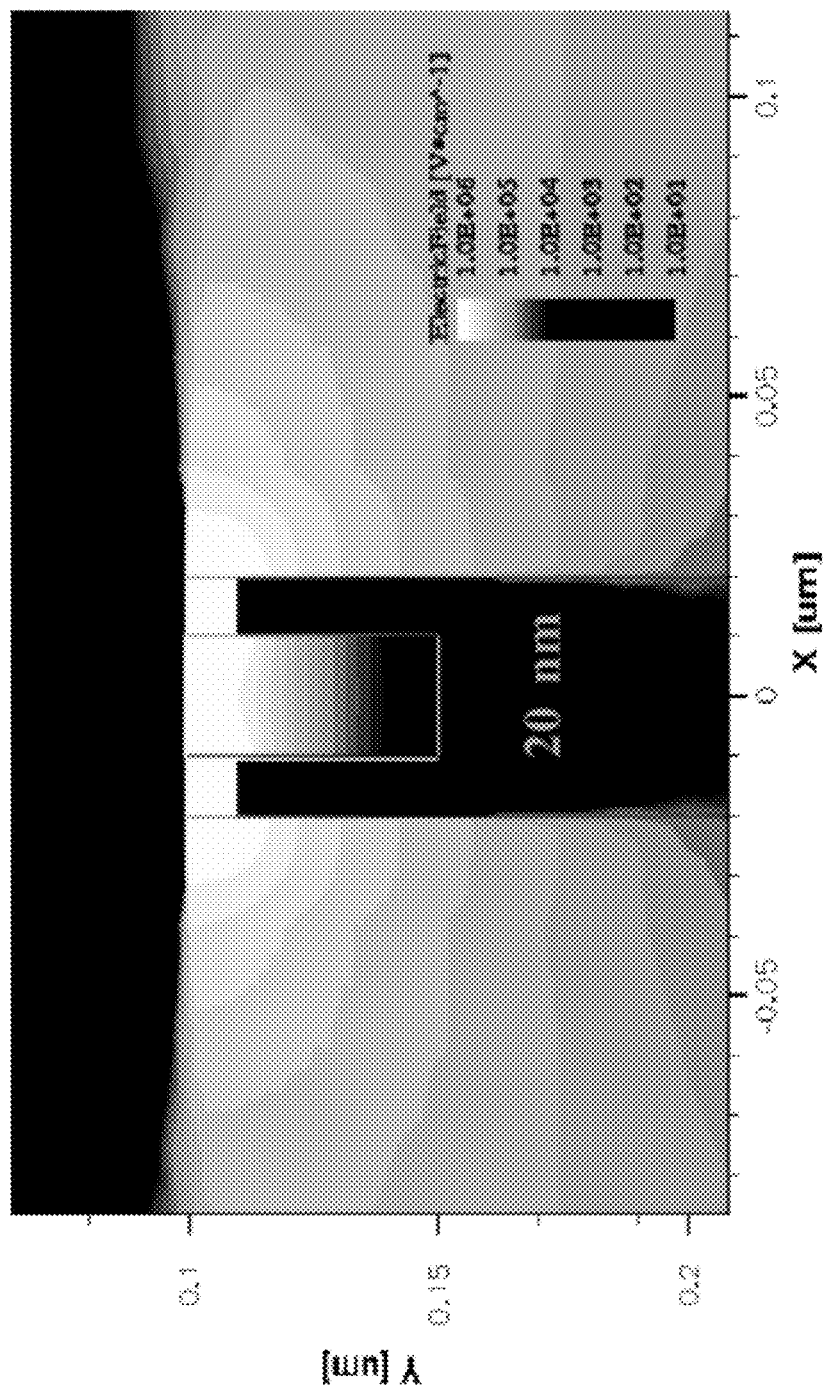
FIG. 13 is a two-dimensional graph of electrical field from simulation of the 20 nm diameter example memory cell with an electrical field enhancement arrangement.

FIG. 13 is a two-dimensional graph of electrical field from simulation of the 100 nm diameter example memory cell with an electrical field enhancement arrangement.

Comparison of FIG. 12 and FIG. 13 indicates, again, that, as the size of the plug scales downward, the two arms of the cross-sectional "U" shape of the conductive element become closer, and the high electric fields, proximate to the ends of the two arms of the cross-sectional "U" shape of the conductive element, increasingly converge at the center.

Figure 14:
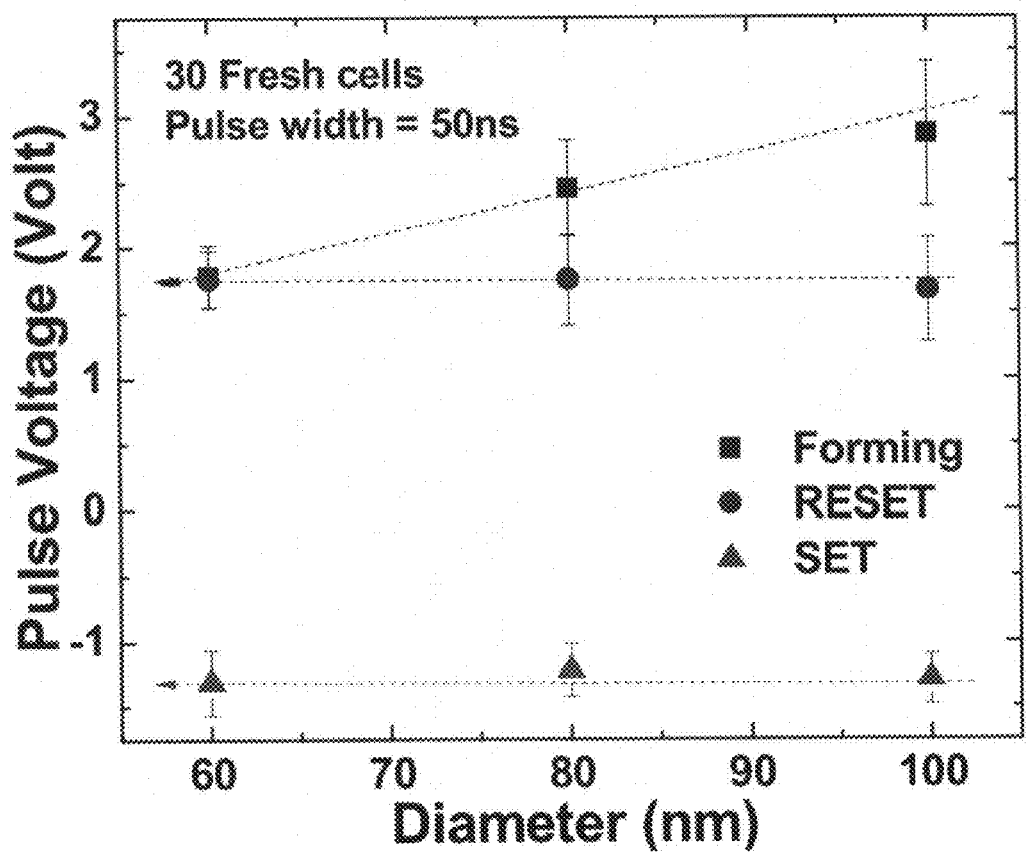
FIG. 14 is a graph of pulse voltage from experimental results of various diameter example memory cells with an electrical field enhancement arrangement undergoing a forming operation.

FIG. 14 is a graph of pulse voltage from experimental results of various diameter example memory cells with an electrical field enhancement arrangement undergoing a forming operation.

Figure 15:
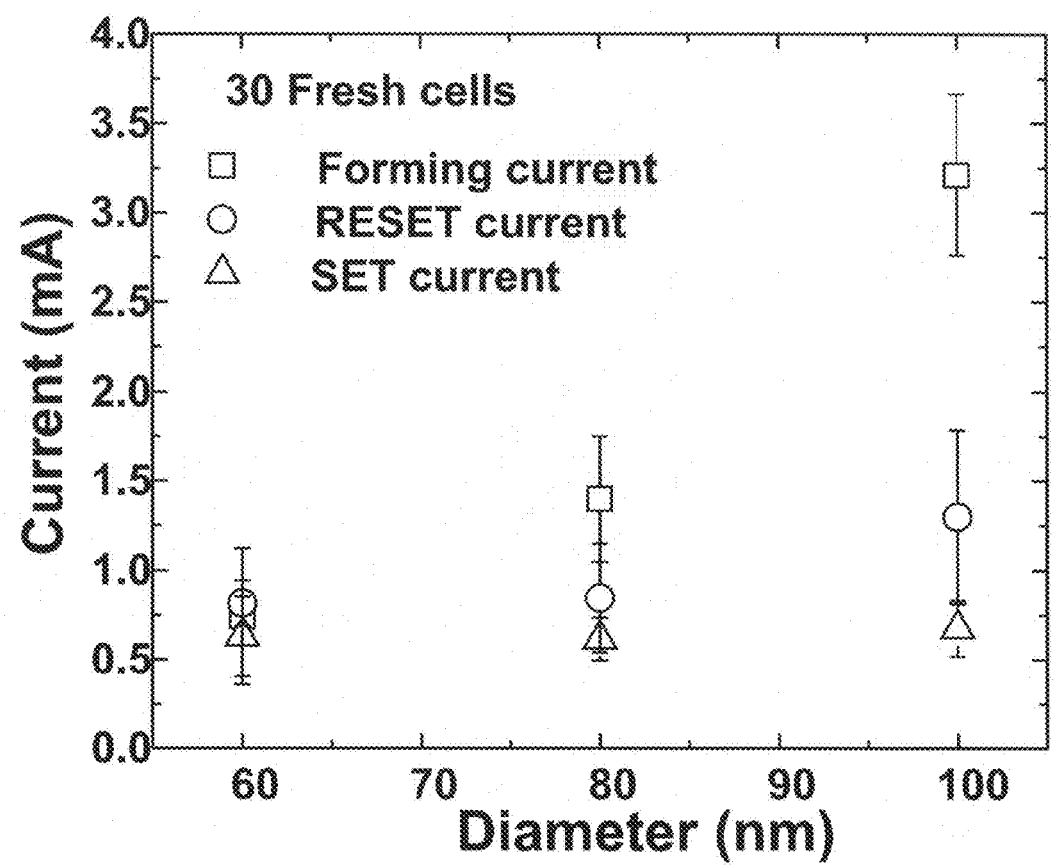
FIG. 15 is a graph of current from experimental results of various diameter example memory cells with an electrical field enhancement arrangement undergoing various operations.

FIG. 15 is a graph of current from experimental results of various diameter example memory cells with an electrical field enhancement arrangement undergoing various operations.

FIGS. 14 and 15 show that the voltage and current required for the initial forming process fall rapidly when the cell size scales. Therefore, at 60 nm or below, the initial forming process is practically eliminated. At such smaller memory cell sizes, the control circuitry can omit, or simply not perform, a distinct formation operation with an instruction code distinct from the instruction codes of a regular set or reset operation. Instead, regular operation can be performed.

Figure 16:
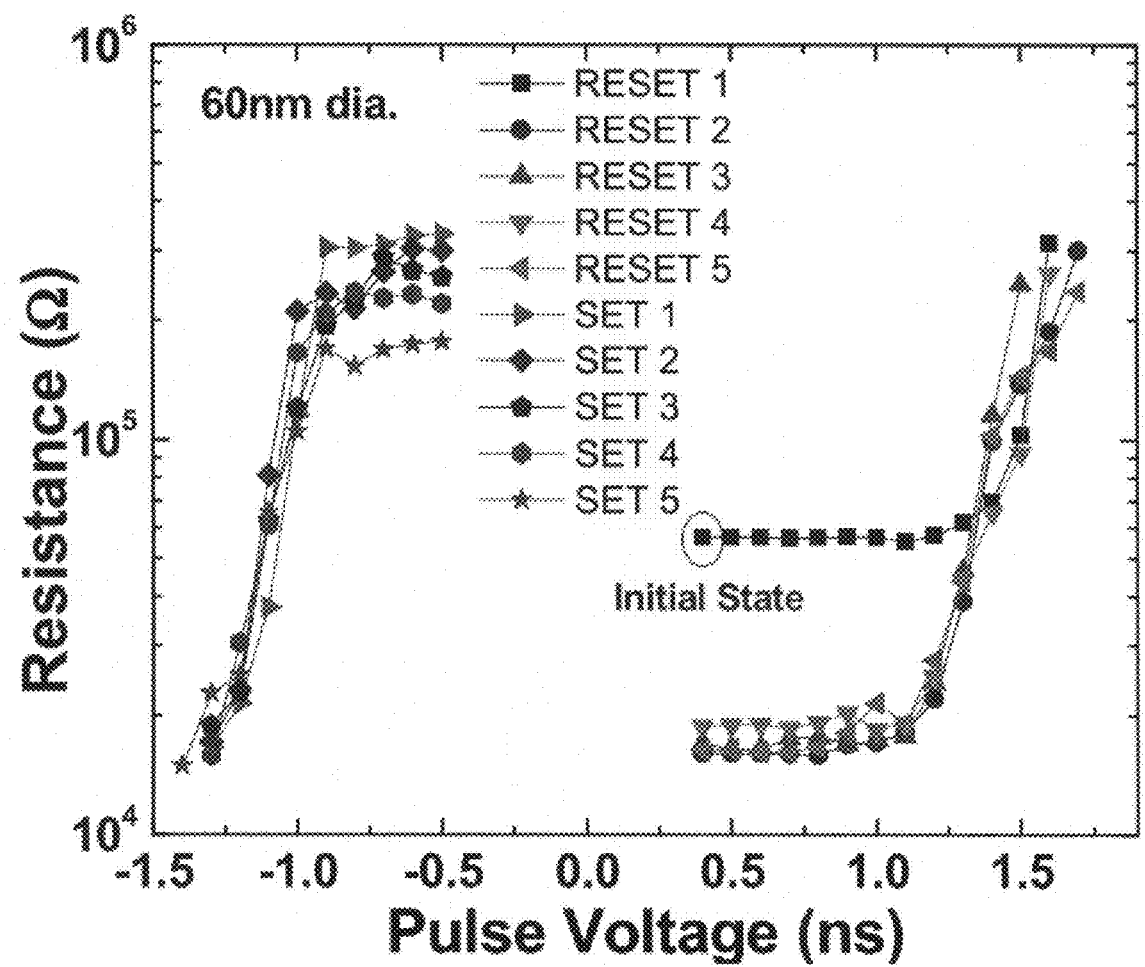
FIG. 16 is a graph of resistance versus pulse voltage duration from experimental results of the 60 nm diameter example memory cell with an electrical field enhancement arrangement undergoing multiple cycles of reset and set operations.

FIG. 16 is a graph of resistance versus pulse voltage duration from experimental results of the 60 nm diameter example memory cell with an electrical field enhancement arrangement undergoing multiple cycles of reset and set operations.

The graph indicates that a distinct forming process is not required for such small memory cells.

Figure 17:
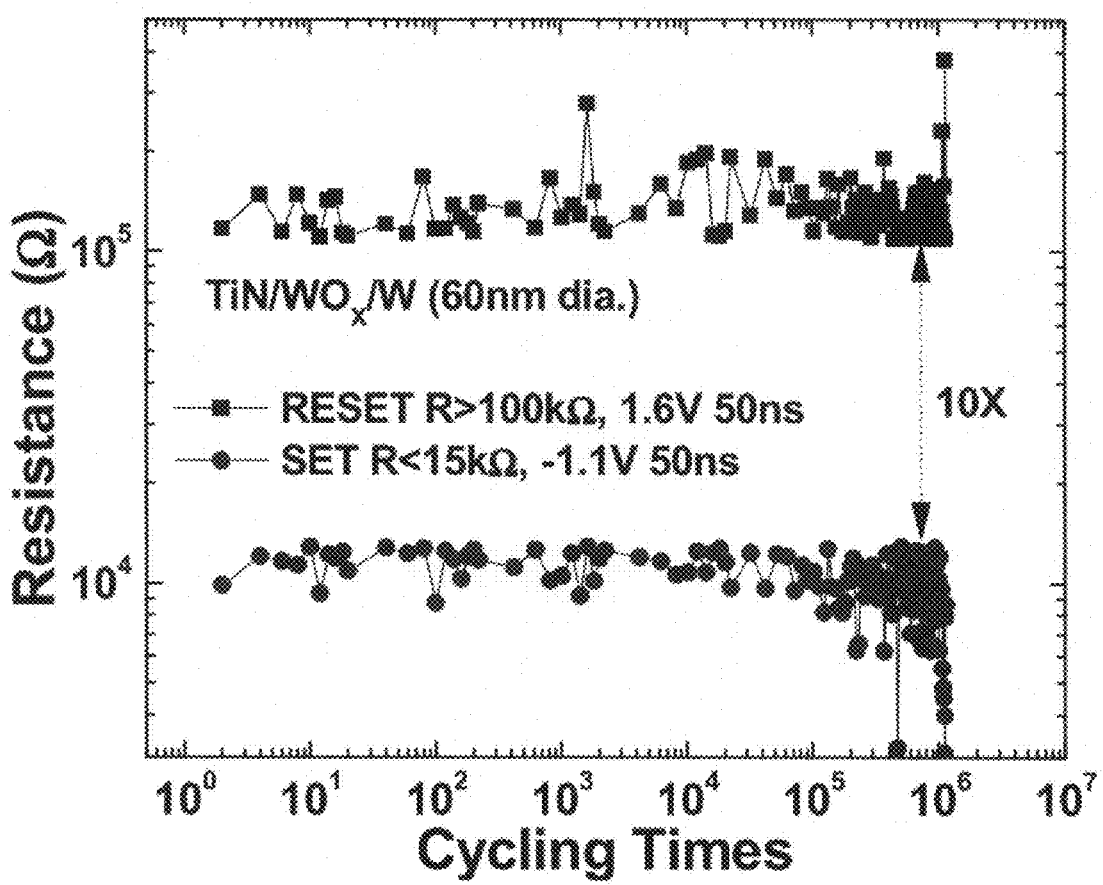
FIG. 17 is a graph of resistance versus number of cycles from the 60 nm diameter example memory cell with an electrical field enhancement arrangement undergoing multiple cycles of reset and set operations.

FIG. 17 is a graph of resistance versus number of cycles from the 60 nm diameter example memory cell with an electrical field enhancement arrangement undergoing multiple cycles of reset and set operations.

The graph indicates that the cycling endurance of the 60 nm devices is > a million times. The RESET/SET resistance window remains well separated throughout a million cycles of RESET/SET operations. The roughly 10× resistance window is well maintained by program-verify algorithms.

Figure 18:
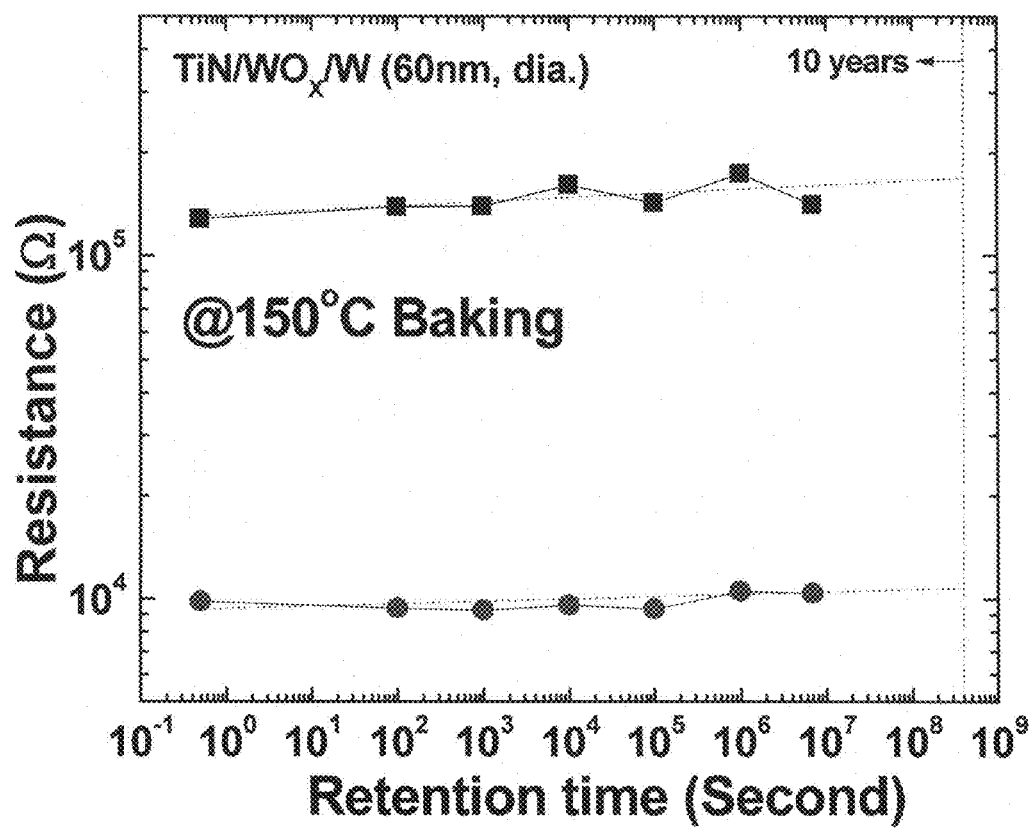
FIG. 18 is a graph of resistance versus retention time for the 60 nm diameter example memory cell with an electrical field enhancement arrangement after a substantial period of heating.

FIG. 18 is a graph of resistance versus retention time for the 60 nm diameter example memory cell with an electrical field enhancement arrangement after a substantial period of heating.

The RESET and SET states are well separated even after 2,000 hours of baking at 150 degrees C.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
    a metal-oxide memory element in a current path between a first electrode at a first voltage and a second electrode at a second voltage;
    a nonconductive element adjacent to the metal-oxide memory element;
    a conductive element in the current path between the first electrode and the second electrode, the conductive element having a first part at a first distance from the first electrode and a second part at a second distance from the first electrode, the first distance larger than the second distance,
    wherein the metal-oxide memory element is between the first part of the conductive element and the first electrode, and the nonconductive element is between the second part of the conductive element and the first electrode.

2. The memory device of claim 1, further comprising:
    circuitry performing a reset operation and a set operation on the metal-oxide memory element, the reset operation and the set operation having a common voltage polarity.

3. The memory device of claim 1, further comprising:
    circuitry performing a reset operation and a set operation on the metal-oxide memory element, the reset operation and the set operation having opposite voltage polarities.

4. The memory device of claim 1, further comprising:
    circuitry performing a reset operation and a set operation on the metal-oxide memory element, prior to regular operation the circuitry not performing a forming operation distinct from the reset operation and the set operation.

5. The memory device of claim 1, wherein the first electrode is oxygen inert.

6. The memory device of claim 1, wherein the nonconductive element comprises an oxide of a liner on the second electrode.

7. The memory device of claim 1, wherein the conductive element comprises a liner on the second electrode and a plug in the liner.

8. The memory device of claim 1, wherein the memory device is an oxide resistive RAM.

9. The memory device of claim 1, wherein the memory device is a magnetic tunnel junction RAM.

10. A method of making a memory device, comprising:
forming a conductive element in a cavity over a first electrode, the conductive element including a first conductive material and a second conductive material;
forming a metal-oxide memory element of the memory device from the first conductive material of the conductive element;
forming a nonconductive element from the second conductive material of the conductive element, the metal-oxide memory element adjacent to the nonconductive element; and
forming a second electrode over the metal-oxide memory element and the conductive element, such that (i) the metal-oxide memory element has a first thickness between a remainder of the conductive element and the second electrode, and (ii) the nonconductive element has a second thickness between the remainder of the conductive element and the second electrode, the first thickness being larger than the second thickness.

11. The method of claim 10, wherein said forming the conductive element, includes forming the conductive element with a surface including the first conductive material and the second conductive material, the first conductive material adjacent to the second conductive material at the surface.

12. The method of claim 10, wherein said forming the metal-oxide memory element and said forming the nonconductive element, are performed together, by oxidizing a surface of the conductive element.

13. The method of claim 10, wherein said forming the conductive element, includes forming the conductive element with a surface including the first conductive material and the second conductive material, the first conductive material adjacent to the second conductive material at the surface,
wherein said forming the metal-oxide memory element and said forming the nonconductive element, are performed together, by oxidizing a surface of the conductive element.

14. The method of claim 10, further comprising:
forming circuitry performing a reset operation and a set operation on the metal-oxide memory element, the reset operation and the set operation having a common voltage polarity.

15. The method of claim 10, further comprising:
forming circuitry performing a reset operation and a set operation on the metal-oxide memory element, the reset operation and the set operation having opposite voltage polarities.

16. The method of claim 10, wherein prior to set and reset operations for regular use of the memory cell, a forming operation distinct from the set and reset operations is unnecessary.

17. The method of claim 10, wherein the second electrode is oxygen inert.

18. The method of claim 10, wherein said forming the nonconductive element comprises:
oxidizing a conductive liner of the conductive element on the bottom electrode.

19. The method of claim 10, wherein said forming the conductive element comprises:
forming a conductive liner on the bottom electrode; and
forming a conductive plug in the conductive liner.

20. The method of claim 10, wherein the memory device made by the method is an oxide resistive RAM.

21. The method of claim 10, wherein the memory device made by the method is a magnetic tunnel junction RAM.

22. A memory device comprising:
a cross-point array of memory cells, memory cells in the array including:
a metal-oxide memory element in a current path between a first electrode at a first voltage and a second electrode at a second voltage;
a nonconductive element adjacent to the metal-oxide memory element;
a conductive element in the current path between the first electrode and the second electrode, the conductive element having a first part at a first distance from the first electrode and a second part at a second distance from the first electrode, the first distance larger than the second distance,
wherein the metal-oxide memory element is between the first part of the conductive element and the first electrode, and the nonconductive element is between the second part of the conductive element and the first electrode.

* * * * *